(12) United States Patent
Nagashima et al.

(10) Patent No.: US 10,354,862 B2
(45) Date of Patent: Jul. 16, 2019

(54) APPARATUS FOR MANUFACTURING GROUP III NITRIDE SINGLE CRYSTAL, METHOD FOR MANUFACTURING GROUP III NITRIDE SINGLE CRYSTAL USING THE APPARATUS, AND ALUMINUM NITRIDE SINGLE CRYSTAL

(71) Applicant: Tokuyama Corporation, Shunan-shi, Yamaguchi (JP)

(72) Inventors: Toru Nagashima, Shunan (JP); Masayuki Fukuda, Shunan (JP)

(73) Assignee: TOKUYAMA CORPORATION, Shunan-Shi, Yamaguchi (JP)

( * ) Notice: Subject to any disclaimer, the term of this patent is extended or adjusted under 35 U.S.C. 154(b) by 0 days.

(21) Appl. No.: 15/525,502

(22) PCT Filed: Nov. 9, 2015

(86) PCT No.: PCT/JP2015/081492
§ 371 (c)(1),
(2) Date: May 9, 2017

(87) PCT Pub. No.: WO2016/076270
PCT Pub. Date: May 19, 2016

(65) Prior Publication Data
US 2017/0330745 A1 Nov. 16, 2017

(30) Foreign Application Priority Data

Nov. 10, 2014 (JP) .................................. 2014-228482
May 18, 2015 (JP) .................................. 2015-101281

(51) Int. Cl.
*H01L 21/02* (2006.01)
*C30B 25/14* (2006.01)
(Continued)

(52) U.S. Cl.
CPC ........ *H01L 21/02389* (2013.01); *C23C 16/34* (2013.01); *C23C 16/455* (2013.01);
(Continued)

(58) Field of Classification Search
CPC combination set(s) only.
See application file for complete search history.

(56) References Cited

U.S. PATENT DOCUMENTS 7,621,999 B2  11/2009  Koukitu et al.
7,645,340 B2  1/2010  Koukitu et al.
(Continued)

FOREIGN PATENT DOCUMENTS

JP  2003-303774 A  10/2003
JP  2006-73578 A   3/2006
(Continued)

OTHER PUBLICATIONS

Raghothamachar et al., "X-Ray Characterization of Bulk AlN Single Crystals Grown by the Sublimation Technique," Journal of Crystal Growth, vol. 25, Mar. 1, 2003, pp. 244-250.
(Continued)

*Primary Examiner* — Erin F Bergner
(74) *Attorney, Agent, or Firm* — Birch, Stewart, Kolasch & Birch, LLP

(57) ABSTRACT

An apparatus for manufacturing a group III nitride single crystal including: a reaction vessel including a reaction area, wherein in the reaction area, a group III source gas and a nitrogen source gas are reacted such that a group III nitride crystal is grown on a substrate; a susceptor arranged in the reaction area and supporting the substrate; a group III source gas supply nozzle supplying the group III source gas to the reaction area; and a nitrogen source gas supply nozzle supplying the nitrogen source gas to the reaction area, wherein the nitrogen source gas supply nozzle is configured
(Continued)

to supply the nitrogen source gas and at least one halogen-based gas selected from the group consisting of a hydrogen halide gas and a halogen gas to the reaction area.

9 Claims, 3 Drawing Sheets

(51) Int. Cl.
  *C23C 16/34* (2006.01)
  *C23C 16/455* (2006.01)
  *H01L 21/205* (2006.01)
  *C30B 29/40* (2006.01)

(52) U.S. Cl.
  CPC ............ *C30B 25/14* (2013.01); *C30B 29/403* (2013.01); *H01L 21/0254* (2013.01); *H01L 21/0262* (2013.01); *H01L 21/02609* (2013.01); *H01L 21/205* (2013.01)

(56) References Cited

U.S. PATENT DOCUMENTS

| | | | | |
|---|---|---|---|---|
| 8,858,708 | B1* | 10/2014 | Callahan | .................. C30B 25/00 117/105 |
| 2003/0013222 | A1* | 1/2003 | Trassoudaine | .......... C30B 29/06 438/46 |
| 2004/0209402 | A1* | 10/2004 | Chai | ....................... C30B 25/02 438/122 |
| 2005/0142391 | A1* | 6/2005 | Dmitriev | ................. C30B 25/00 428/698 |
| 2009/0283028 | A1* | 11/2009 | Schowalter | ....... H01L 21/02389 117/9 |
| 2014/0346638 | A1 | 11/2014 | Koukitu et al. | |
| 2016/0108554 | A1 | 4/2016 | Koukitsu et al. | |

FOREIGN PATENT DOCUMENTS

| | | |
|---|---|---|
| JP | 2006-114845 A | 4/2006 |
| JP | 2012-166963 A | 9/2012 |
| JP | 2013-60340 A | 4/2013 |
| JP | 2013-229554 A | 11/2013 |
| JP | WO 2014/031119 A1 | 2/2014 |
| JP | 2014-172787 A | 9/2014 |
| JP | 2015-17030 A | 1/2015 |
| WO | WO 2012/081670 A1 | 6/2012 |
| WO | WO 2013/094058 A1 | 6/2013 |

OTHER PUBLICATIONS

International Search Report for PCT/JP2015/081492 (PCT/ISA/210) dated Feb. 16, 2016.

Lu et al., "Seeded growth of AlN bulk crystals in *m*- and *c*-orientation", Journal of Crystal Growth, vol. 312, No. 1, 2009, pp. 58-63.

Written Opinion of the International Searching Authority for PCT/JP2015/081492 (PCT/ISA/237) dated Feb. 16, 2016.

* cited by examiner

APPARATUS FOR MANUFACTURING GROUP III NITRIDE SINGLE CRYSTAL, METHOD FOR MANUFACTURING GROUP III NITRIDE SINGLE CRYSTAL USING THE APPARATUS, AND ALUMINUM NITRIDE SINGLE CRYSTAL

TECHNICAL FIELD

The present invention relates to a new vapor deposition apparatus for growing a group III nitride single crystal onto a substrate by reaction of a plurality of source gases, and a new method for manufacturing a group III nitride single crystal using the apparatus. The present invention also relates to a new aluminum nitride single crystal.

BACKGROUND

Group III nitride semiconductor crystals, such as aluminum nitride, gallium nitride and indium nitride, have a wide range of band gap energy value. Their band gap energies are around 6.2 eV, around 3.4 eV, and around 0.7 eV, respectively. Mixed crystal semiconductor of any composition may be formed of these group III nitride semiconductors, and according to the composition of mixed crystal, band gaps having values between the above band gaps can be obtained.

Therefore, by using group III nitride semiconductor crystals, it is possible to make light emitting devices having a wide range of emitting right from infrared light to ultraviolet light in principle. Specifically, development of light emitting devices having aluminum-based group III nitride semiconductors (mainly aluminum gallium nitride mixed crystal) has been vigorously promoted recently. The use of an aluminum-based group III nitride semiconductor enables emission of short wavelength light in the ultraviolet range, which makes it possible to manufacture light emitting light sources such as ultraviolet light emitting diodes for white light sources, ultraviolet light emitting diodes for sterilization, laser for read/write of high density optical disc memories, and laser for communication.

A light emitting device having a group III nitride semiconductor (e.g. aluminum-based group III nitride semiconductor) may be formed by sequentially stacking thin films of semiconductor single crystal (specifically, thin films to be n-type semiconductor layer, light emitting layer, and p-type semiconductor layer) of around several microns in thickness onto a substrate, in the same way as in forming conventional semiconductor light emitting devices. The thin films of such a semiconductor single crystal may be formed by crystal growth methods such as Molecular Beam Epitaxy (MBE), and Metalorganic Chemical Vapor Deposition (MOCVD). As to a group III nitride semiconductor light emitting device as well, such methods are tried to be applied to form a preferable layer structure as a light emitting device.

At the moment, in manufacturing a group III nitride semiconductor light emitting device, generally employed is sapphire substrate, in view of crystal quality as a substrate, permeability of ultraviolet light, mass productivity and cost. However, when a group III nitride is grown on a sapphire substrate, crystal defects (misfit dislocation), cracks and the like occur due to differences in lattice constant, thermal expansion coefficient and the like between the sapphire substrate and the group III nitride to form semiconductor stacked layer (e.g. aluminum gallium nitride), which results in a degradation of light emitting performance of the device.

In order to solve these problems, in forming a semiconductor stacked film, it is desirable to use a substrate having a lattice constant and thermal expansion coefficient close to that of the semiconductor stacked film. As a substrate to form a group III nitride semiconductor thin film, group III nitride single crystal substrate is most suitable. For example, as a substrate to form an aluminum-based group III nitride semiconductor thin film, aluminum nitride single crystal substrate and aluminum gallium nitride single crystal substrate are most preferable.

In order to use a group III nitride single crystal as a substrate, it is preferable that the single crystal has a certain degree of thickness (e.g. no less than 10 μm), in view of mechanical intensity. MOCVD is suitable for manufacturing a group III nitride single crystal substrate, because crystals grow faster by MOCVD compared to MBE. As a growing method of a group III nitride single crystal of higher growth rate of film formation than MOCVD, Hydride Vapor Phase Epitaxy (HVPE) is known (see Patent Literatures 1 to 3). HVPE is not suitable for precise control of film thickness compared to MBE and MOCVD, whereas HVPE can grow single crystals of good crystallinity at a high growth rate of film formation. Thus, HVPE is especially suitable for mass production of single crystal substrates. The growing of a group III nitride single crystal by MOCVD and HVPE is carried out by supplying a group III source gas and a nitrogen source gas in a reaction vessel, and reacting the gases on a heated substrate.

Relating to manufacturing of group III nitride single crystals, for example Patent Literature 4 discloses a hydride vapor phase epitaxy apparatus including a reaction vessel, a group III source gas generation part to generate a group III halide gas, and a group III halide gas introducing pipe to supply the group III halide gas to a reaction zone of the reaction vessel. Patent Literature 4 describes that an inlet at an end of the group III halide gas introducing pipe penetrates an end wall of an outer chamber of the reaction vessel, and the inlet at the end of the group III halide gas introducing pipe joins to a first nozzle arranged inside an inner chamber of the reaction vessel.

CITATION LIST

Patent Literature

Patent Literature 1: JP 2003-303774 A
Patent Literature 2: JP 2006-073578 A
Patent Literature 3: JP 2006-114845 A
Patent Literature 4: JP 2013-060340 A
Patent Literature 5: WO 2014/031119
Patent Literature 6: JP 2012-166963 A
Patent Literature 7: WO 2012/081670
Patent Literature 8: JP 2015-017030 A

SUMMARY

Technical Problem

As a result of further examination by the inventors of the present invention, it is found that when a single crystal is grown by HVPE, especially an aluminum nitride single crystal is grown by HVPE, the reactivity of source gas is high, and adhesion particles, whose cause is considered as dirt attached in the vapor deposition apparatus including nozzles, are taken in the crystal, to easily form crystal defects. If particles adhere to a growing crystal, they become crystal defects, and the light emitting diode manufactured from the crystal decreases its yield. In the growth of an aluminum nitride single crystal, in order to reduce the adhesion particles, suggested is to provide a current plate in the vapor phase apparatus (see Patent Literature 5 for example). According to this method, it is possible to reduce the number of adhesion particles that can be observed by a Nomarski differential interference contrast microscope (observed by 100 to 500×).

However, as a result of further examination by the inventors of the present invention, it was found that minute crystal defects, which cannot be found by a Nomarski differential interference contrast microscope and are not caused by the adhesion particles, exist in the aluminum nitride single crystal, even though a current plate is used. Such fine defects are able to be found by reflection X-ray topography. That is, even when the source gas flow in the apparatus is adjusted by a current plate, the aluminum nitride single crystal to be obtained has bright spots considered as crystal defects when evaluated with reflection X-ray topography.

An object of the present invention is to provide an apparatus for manufacturing a group III nitride single crystal that can reduce crystal defects, in a vapor deposition apparatus to grow a crystal on a substrate by reaction of a group III source gas and a nitrogen source gas. The present invention also provides a method for growing a crystal by the apparatus. The present invention also provides an aluminum nitride single crystal in which crystal defects observed as bright spots by reflection X-ray topography are reduced.

The bright spots observed by reflection X-ray topography in the present description correspond to crystal defects found in observation of diffraction image for example from a (114) plane of an aluminum nitride single crystal (AlN single crystal) substrate by reflection X-ray topography. When the (114) plane is observed, the bright spots are observed as a result of reinforcement of defect parts. If the diffraction plane to be measured is changed, the defect parts may be shown as dark spots.

Solution to Problem

As a result of examination by the inventors of the present invention, it is found that the above problem can be solved by simultaneously supplying a nitrogen source gas and at least one halogen-based gas selected from the group consisting of a hydrogen halide gas and a halogen gas, from a same supply nozzle to a reaction area.

A first aspect of the present invention is an apparatus for manufacturing a group III nitride single crystal including: a reaction vessel including a reaction area, wherein in the reaction area, a group III source gas and a nitrogen source gas are reacted such that a group III nitride crystal is grown on a substrate; a susceptor arranged in the reaction area and supporting the substrate; a group III source gas supply nozzle supplying the group III source gas to the reaction area; and a nitrogen source gas supply nozzle supplying the nitrogen source gas to the reaction area, wherein the nitrogen source gas supply nozzle is configured to supply the nitrogen source gas and at least one halogen-based gas selected from the group consisting of a hydrogen halide gas and a halogen gas to the reaction area.

A second aspect of the present invention is a method of manufacturing a group III nitride single crystal including the step of: (a) supplying a group III source gas and a nitrogen source gas to the reaction area of the apparatus for manufacturing the group III nitride single crystal as in any one of claims 1 to 5, such that the group III source gas and the nitrogen source gas react, wherein in the step (a), the nitrogen source gas and at least one halogen-based gas selected from a hydrogen halide gas and a halogen gas are supplied to the reaction area from the nitrogen source gas supply nozzle.

A third aspect of the present invention is an aluminum nitride single crystal having a number density of bright spots in a X-ray reflection topography image of a (114) plane thereof of no more than 20 cm$^{-2}$.

A fourth aspect of the present invention is a method of manufacturing a wafer including: forming a layer of light emission devices on the aluminum nitride single crystal as in the third aspect of the present invention.

A fifth aspect of the present invention is a method of manufacturing a light emitting diode including: manufacturing a wafer by the method as in the fourth aspect; and cutting the wafer.

Advantageous Effects of Invention

According to the apparatus for manufacturing a group III nitride single crystal of the first aspect of the present invention, it is possible to inhibit a high reactivity of a group III source and a nitrogen source, in a vapor deposition apparatus to grow a crystal on a substrate by reaction of a plurality of source gases. Therefore, it is possible to grow a group III nitride crystal in which minute crystal defects are reduced.

According to the method for manufacturing a group III nitride single crystal of the second aspect of the present invention, it is possible to manufacture a group III nitride single crystal in which minute crystal defects are reduced.

According to the third aspect of the present invention, it is possible to provide a high quality group III nitride single crystal having excellent permeability of ultraviolet region, in which minute crystal defects are reduced.

According to the method for manufacturing a wafer of the fourth aspect of the present invention, it is possible to manufacture a wafer with which the manufacturing yield of light emitting devices can be improved.

According to the method for manufacturing a light emitting diode of the fifth aspect of the present invention, it is possible to improve the manufacturing yield of light emitting devices.

DESCRIPTION OF EMBODIMENTS

Figure 1:
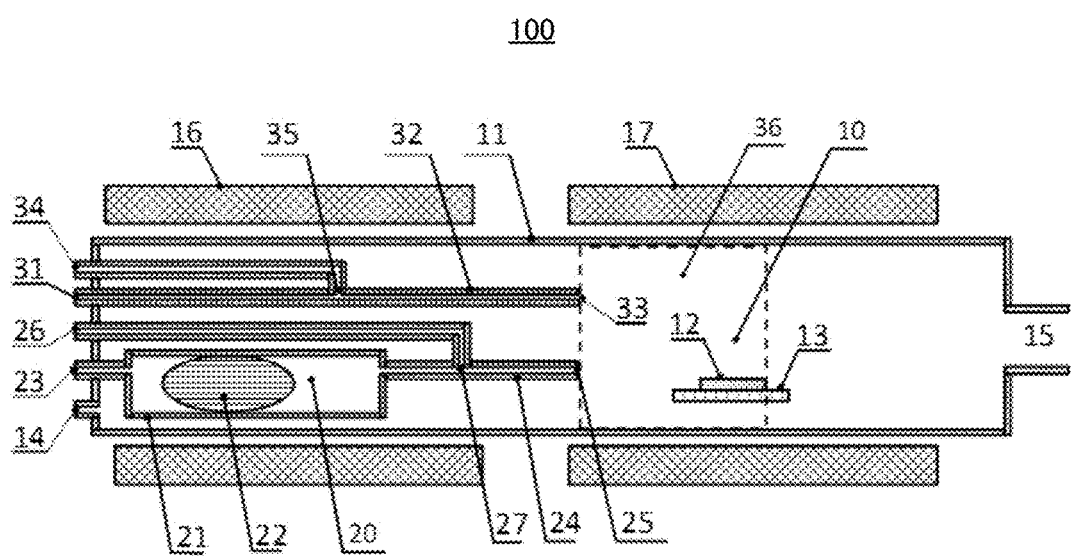
FIG. 1 is a cross-sectional view to schematically explain a vapor deposition apparatus 100 according to an embodiment of the present invention.

Hereinafter, the present invention will be described with reference to the drawings. In the drawings, some symbols may be omitted. In the present invention, unless otherwise mentioned, "A to B" regarding numerical values A and B means "A or more and B or less". When the unit of the numerical value A is omitted, the unit given to the numerical value B is applied as the unit of the numerical value A. It is noted that the embodiments shown below are examples of the present invention and the present invention is not limited to the embodiments.

<1. Apparatus for Manufacturing Group III Nitride Single Crystal>

An apparatus for manufacturing a group III nitride single crystal according to the first aspect of the present invention will be described. FIG. 1 is a cross-sectional view to schematically explain a group III nitride single crystal manufacturing apparatus 100 according to an embodiment of the present invention (hereinafter may be referred to as "apparatus 100").

The group III nitride single crystal manufacturing apparatus 100 includes:
a reaction vessel 11 including a reaction area 10, wherein in the reaction area, a group III source gas and a nitrogen source gas are reacted such that a crystal is grown on a substrate;
a susceptor 13 arranged in the reaction area and supporting the substrate (base substrate) 12;
a group III source gas supply nozzle 24 supplying the group III source gas to the reaction area 10; and
a nitrogen source gas supply nozzle 32 supplying the nitrogen source gas to the reaction area 10.

The nitrogen source gas supply nozzle 32 is configured to supply the nitrogen source gas and at least one halogen-based gas selected from the group consisting of a hydrogen halide gas and a halogen gas (hereinafter may be simply referred to as "halogen-based gas") to the reaction area.

The halogen-based gas may be a gas formed of a hydrogen halide gas, may be a gas formed of a halogen gas, and may be a mixture gas of a hydrogen halide gas and a halogen gas.

FIG. 1 shows an example of a structure to introduce the halogen-based gas to the nitrogen source gas supply nozzle 32. In the apparatus 100, the nitrogen source gas supply nozzle 32 includes: a nitrogen source gas inlet 31 from which the nitrogen source gas is introduced to the reaction vessel 11; a nitrogen source gas outlet 33 from which the nitrogen source gas flows out to the reaction area 10; and a junction 35 arranged between the nitrogen source gas inlet 31 and the nitrogen source gas outlet 33, wherein a halogen-based gas inlet nozzle 34 (group V additional halogen-based gas inlet nozzle 34, hereinafter the halogen-based gas added to the nitrogen source gas may be referred to as "group V additional halogen-based gas") is joined to the nitrogen source gas supply nozzle at the junction, and wherein the halogen-based gas inlet nozzle 34 supplies the halogen-based gas. The apparatus for manufacturing a group III nitride single crystal of the present invention is not limited to the structure shown in FIG. 1, as long as the nitrogen source gas supply nozzle can simultaneously supply the nitrogen source gas and at least one halogen-based gas selected from the group consisting of a hydrogen halide gas and a halogen gas.

The apparatus 100 of FIG. 1 also includes: a source part reaction vessel 21 arranged on the upstream side of the reaction area 10, including a source part reaction area 20 for reacting the halogen-based gas and a group III metal source 22 to generate a group III source gas; and a source halogen-based gas inlet nozzle 23 from which the halogen-based gas is introduced to the source part reaction vessel 21. The group III source gas supply nozzle 24 includes a group III source gas outlet 25 from which the group III source gas flows out to the reaction area 10.

In the group III nitride single crystal manufacturing apparatus 100, a group III halide gas is used as the group III source gas, and a nitrogen source gas is used as the nitrogen source gas, to grow a group III nitride single crystal by HVPE. There is a gas exhaust outlet 15 of the reaction vessel 11 arranged on the downstream side of the reaction area 10, and the gases supplied to the reaction vessel 11 are emitted outside the reaction vessel 11 from the gas exhaust outlet 15. Hereinafter a case in which HVPE is employed is explained.

The apparatus 100 may further include an outer chamber outside the reaction vessel 11, though the outer chamber is not shown in FIG. 1. In the reaction area 10, the susceptor 13 is arranged. The susceptor 13 may be connected to a rotating driving shaft (not shown) so as to support the substrate 12 in such a manner that the substrate 12 can rotate. The rotating driving shaft transmits power from an electromotor to the susceptor 13, to rotate the susceptor 13 at a proper rotating speed. The reaction vessel 11 further includes a local heater (not shown), such as a high-frequency coil, for heating the susceptor 13. As the local heater, known heaters other than a high-frequency coil, such as resistance type heater, can also be employed as long as the heater can properly heat the susceptor.

In the source part reaction vessel 21, a group III metal source 22 (e.g. aluminum and gallium) is arranged. By a supply of the halogen-base gas (specifically, hydrogen chloride gas or chloride gas) to the source part reaction vessel 21, a group III halide gas (e.g. aluminum chloride gas and gallium chloride gas) as the group III source gas is generated in the source part reaction area 20. The group III halide gas may be generated by reaction of a heated solid or liquid of a group III metal (e.g. aluminum, gallium and indium) and a hydrogen halide gas (e.g. hydrogen bromide gas and hydrogen chloride gas) or a halogen gas (e.g. chlorine gas). In order to progress this reaction, the source part reaction vessel 21 is heated by a source part outer heater 16, to a temperature suitable for the reaction (for example, for the generation of aluminum chloride gas, normally around 150 to 1000° C., preferably around 300 to 660° C., and more preferably around 300 to 600° C., for the generation of gallium chloride gas, normally around 300 to 1000° C.). As the source part outer heater 16, known heater such as resistance type heater may be used without particular limitations.

The group III halide gas (group III source gas) generated in the source part reaction vessel 21 is introduced to the reaction area 10 in the reaction vessel 11, by the group III source gas supply nozzle 24. The group III source gas supply nozzle 24 is arranged in a manner to eject the group III halide gas (group III source gas) from the diagonally upper side to the upper side of the susceptor 13.

The group III source gas supply nozzle 24 includes a group III source gas supply nozzle outlet 25 at one end thereof. The other end of the group III source gas supply nozzle 24 is connected to the source part reaction vessel 21. The group III source gas supply nozzle 24 may have a joint removably attached to a portion between one end to the other end of the group III source gas supply nozzle 24. By including the removable joint arranged at the group III source gas supply nozzle 24, the group III source gas supply nozzle 24 can be easily replaced when deposits are generated around the outlet of the group III source gas supply nozzle 24 by growth of a group III nitride single crystal. For the joint, any known jointing systems, such as screw joint, may be used without particular limitations. For example, in view of easy attachment/detachment, and good airtightness of the joint to achieve less gas leakage, a tapered ground joint may be preferably used.

In addition, a group III additional halogen-based gas confluence part 27, where a halogen-based gas supply nozzle 26 (group III additional halogen-based gas supply nozzle 26) for supplying a halogen-based gas (hereinafter the halogen-based gas to be added to the group III source gas may be referred to as "group III additional halogen-based gas) is joined, may be arranged at a freely-selected position from the group III source gas outlet 25, which is one end of the group III source gas supply nozzle 24, to the source part reaction vessel 21, which is the other end of the group III source gas supply nozzle 24. The group III additional halogen-based gas is a hydrogen halide (e.g. hydrogen chloride gas) and/or a halogen gas (e.g. chlorine gas). By making the group III additional halogen-based gas join to the group III halide gas generated inside the source part reaction vessel 21, it is possible to freely control the gas composition ratio of the group III halide gas and the group III additional halogen-based gas.

Examples of the material for the source halogen-based gas supply nozzle 23 for supplying the group III source gas, the source part reaction vessel 21, the group III additional halogen-based gas supply nozzle 26, the group III additional halogen-based gas confluence part 27, the group III source gas supply nozzle 24, and the attachable joint (not shown) arranged at the group III source gas supply nozzle 24 include heat-resistant glass, quarts glass, alumina, zirconia, stainless steel, corrosion resistant alloys such as inconel and the like. Among them, quarts glass may be preferably used.

The nitrogen source gas supply nozzle 32 leads the nitrogen source gas from the nitrogen source gas inlet 31 to the reaction area 10. The nitrogen source gas outlet 33 of the nitrogen source gas inlet 31 is arranged in a manner to eject the nitrogen source gas from the diagonally upper side of the susceptor 13 and the upper side of the group III source gas supply nozzle outlet 25 of the source halogen-based gas supply nozzle 23 to the upper side of the susceptor 13.

In the apparatus 100, a junction 35, where a halogen-based gas inlet nozzle 34 (group V additional halogen-based gas inlet nozzle 34) for supplying the group V additional halogen-based gas is joined, may be arranged at a freely-selected position from the nitrogen source gas outlet 33, which is one end of the nitrogen source gas supply nozzle 32, to the nitrogen source gas inlet 31, which is the other end of the nitrogen source gas supply nozzle 32. On the upstream side of the junction 35, the group V additional halogen-based gas inlet nozzle 34 to introduce the group V additional halogen-based gas is arranged. From the group V additional halogen-based gas inlet nozzle 34, the group V additional halogen-based gas is introduced. The group V additional halogen-based gas is a hydrogen halide gas (e.g. hydrogen chloride gas) and/or a halogen gas (e.g. chloride gas), and joins to the nitrogen source gas supplied from the nitrogen source gas inlet 31 at the junction 35. The joined group V additional halogen-based gas is supplied to the reaction area 10 from the nitrogen source gas outlet 33, with the nitrogen source gas.

The nitrogen source gas supply nozzle 32 has the nitrogen source gas outlet 33 at one end portion. The other end portion is connected to the nitrogen source gas inlet 31. The nitrogen source gas supply nozzle 32 may have an attachable joint (not shown) between the one end portion and the other end portion. By arranging the attachable joint at the nitrogen source gas supply nozzle 32, the nitrogen source gas supply nozzle 32 can be easily replaced when deposits are generated around the outlet of the nitrogen source gas supply nozzle 32 by the growth of a group III nitride single crystal. For the joint, any known jointing system, such as screw joint, may be used without particular limitations. For example, in view of easy attachment/detachment and good airtightness of the joint to achieve less gas leakage, a tapered ground joint may be preferably used.

By arranging the nitrogen source gas outlet 33 at a position higher than the group III source gas supply outlet 25, it is possible to supply the nitrogen source gas (nitrogen source gas) uniformly onto the suscepter 13. It is preferable to arrange the nitrogen source gas inlet 31 at a position higher than the group III source gas supply nozzle outlet 25. However, when ammonia gas is used as the nitrogen source gas, the nitrogen source gas outlet 33 may be arranged at a position lower than the group III source gas outlet 25, because ammonia gas is relatively easy to diffuse.

Examples of the material for the nitrogen source gas inlet 31 to supply the nitrogen source gas, the group V additional halogen-based gas inlet 34, the group V additional halogen-based gas inlet nozzle 34, the junction 35, the nitrogen source gas supply nozzle 32, and the attachable joint (not shown) arranged to the nitrogen source gas supply nozzle 32 include heat-resistant glass, quarts glass, alumina, zirconia, stainless steels, corrosion resistant alloys such as inconel, and the like. Among them, quarts glass may be preferably used.

By the reaction of the group III source gas supplied from the group III source gas outlet 25 and the nitrogen source gas supplied from the nitrogen source gas outlet 33 in the reaction area 10 of a growth part, a group III nitride single crystal grows on the substrate 12 arranged on the susceptor 13. In order to progress this reaction, the substrate 12 is heated to a temperature suitable for the reaction (for example, for growing a nitride aluminum single crystal, normally around 1000 to 1700° C., preferably around 1200 to 1700° C., more preferably around 1350 to 1650° C., and for growing a gallium nitride single crystal, normally around 800 to 1100° C.). To heat the substrate, a local heater may be used as described above, and a growth part outer heater 17 may be arranged outside the reaction vessel 11, to heat the entirety of the reaction vessel 11. The local heater and the growth part outer heater may be used separately or in combination. As the growth part outer heater 17, known heaters such as high-frequency heater, resistance heater, and optical heater may be used without particular limitations.

In the apparatus 100, the reaction vessel 11 is preferably formed of a heat-resistant and acid-resistant non-metal material, such as quarts glass, alumina, sapphire, and heat-resistant glass, because the reaction vessel 11 has the reaction area 10 inside thereof. An outer chamber (not shown) may also be arranged at the outer periphery of the reaction vessel 11 to process the reaction vessel 11. The outer chamber may be formed of the same material as that of the reaction vessel 11. The outer chamber may also be formed of a normal metal material, such as stainless steel, because it does not have direct contact with the reaction area 10.

In the above explanation regarding the present invention, the group III nitride single crystal manufacturing apparatus 100 having a configuration in which a group III nitride single crystal is grown by HVPE is mainly shown as an example. However, the present invention is not limited to this configuration. For example, the apparatus 100 may be a vapor deposition apparatus that grows a group III nitride single crystal by MOCVD. More specifically, the apparatus 100 may be a vapor deposition apparatus in which the group III source supply part supplies a group III organic metal compound gas (e.g. trimethylaluminum gas and trimethylgallium gas) as the group III source gas. In this case, a gas of evaporated group III organic metal compound may be supplied as the group III source gas, without arranging the group III metal source 22 in the source part reaction vessel 21.

Even when a group III nitride single crystal is grown by HVPE, it is possible to have a configuration in which the group III metal source 22 is not arranged in the source part reaction vessel 21. For example, it is possible to have a configuration in which a group III halide gas separately evaporated or released from a gas storage apparatus is heated to a desirable temperature (e.g. 150 to 1000° C.) by a heater, and supplied as the group III source gas.

When a mixed crystal is grown by HVPE for example, it is also possible to arrange a plurality of group III metal sources in the source part reaction vessel, to generate a mixture gas of group III halide gas with a supply of a halide gas, and introduce the mixture gas in the reaction area 10, via the group III source gas supply nozzle 24. It is also possible to have a configuration in which the group III metal source is not arranged in the source part reaction vessel, that is, a configuration in which a mixture gas of group III halide gas is separately generated without the reaction of a halide gas and a group III metal, and the mixture gas is heated to a desirable temperature (e.g. 150 to 1000° C.) by a heater, to be supplied as the group III source gas. In the apparatus 100 of FIG. 1, the source part reaction vessel 21 is arranged inside the reaction vessel 11. However, the source reaction vessel may be arranged outside the reaction vessel.

In the above explanation regarding the present invention, the apparatus 100 having a structure in which the nitrogen source gas supply nozzle 32 is configured to introduce a halogen-based gas is shown as an example. In the apparatus 100, the group V additional halogen-based gas is introduced from the group V additional halogen-based gas inlet nozzle 34, and joined to the nitrogen source gas supplied from the nitrogen source gas inlet 31 at the junction 35. The joined group V additional halogen-based gas is supplied to the reaction area 10 from the nitrogen source gas outlet 33, with the nitrogen source gas. The nitrogen source gas supplied to the reaction area 10 reacts with the group III source gas supplied to the reaction area 10 from the group III source gas supply outlet 25, whereby a group III nitride single crystal grows on the substrate 12 by HVPE. The above-described group V additional halogen-based has a role to reduce the progression of the reaction of the group III source gas and the nitrogen source gas in the reaction area 10. It is considered that the inhibition of the reaction of the gases in the vapor phase and the inhibition of the generation of fine particles of the group III nitride crystal provide an effect of reducing minute crystal defects in the group III nitride single crystal that grows on the substrate 12. As a result, it is considered that, it is possible not only to reduce minute crystal defects observed as bright spots in a reflection X-ray topography image of the group III nitride single crystal to be manufactured, but also to provide an effect of reducing adhesion particles observed by a Nomarski differential interference contrast microscope.

The nitrogen source gas, such as ammonia gas, easily reacts with the group V additional halogen-based gas, to form a compound of low steam pressure. For this reason, in the apparatus 100, it is preferable to have the outer heater at the outer periphery of the apparatus, in order to control the gas temperature of the mixed nitrogen source gas and group V additional halogen-based gas. For example, when ammonia gas is supplied as the nitrogen source gas, and a hydrogen chloride gas and/or a chloride gas is supplied as the group V additional halogen-based gas, it is preferable to keep the gas temperature to no less than 250° C., more preferably no less than 335° C., and further preferably no less than 350° C., from when the gas passes through the junction 35 where the group V additional halogen-based gas and the nitrogen source gas are joined together until when the gas passes through the downstream side of the gas flow, at least until when the gas passes through the substrate 12, to inhibit the deposition of ammonium chloride generated by the reaction of the ammonia gas and a hydrogen chloride gas and/or a chloride gas. The upper limit value of the temperature of the gas flow on the downstream side of the junction 35 is not particularly limited, and may be no more than 1200° C. for example. In order to make the control easy, the temperature of the nitrogen source gas and the group V additional halogen gas on the upstream side of the junction 35 may be preferably no less than 250° C., more preferably no less than 335° C., and further preferably no less than 350° C. The upper limit value of the gas temperature on the upstream side of the junction 35 is not particularly limited either, and may be no more than 1200° C. for example. In order to make the deposition difficult to occur, it is also possible to supply the nitrogen source gas and the group V additional halogen-based gas while diluting the gases with a known carrier gas such as nitrogen gas, hydrogen gas and rare gas.

The above group V additional halogen-based gas may be heated by a known heater, together with the source part reaction vessel 21, as in the apparatus 100 shown in FIG. 1. In this case, the temperature of the group V additional halogen-based gas is almost same as the temperature of the source reaction vessel 21. In order to control the temperatures of the group V additional halogen-based gas and the source part reaction vessel 21 so that the temperatures are different from each other, it is also possible to have a configuration in which the positions of the junction 35 and the source part reaction vessel 21 are shifted from each other in the direction of gas flow, to heat them separately (for example, heat the group V additional halogen-based gas separately).

In the apparatus for manufacturing a group III nitride single crystal of the present invention, it is preferable that the group V additional halogen-based gas is supplied in the reaction area from the nitrogen source gas supply nozzle in an amount such that the ratio of a molar amount of halogen atoms in the group V additional halogen-based has to a molar amount of nitrogen atoms in the nitrogen source gas:

$$R_{V\text{-}H}=(\text{a molar amount of halogen atoms in the halogen-based gas})/(\text{a molar amount of nitrogen atoms in the nitrogen source gas})$$

is greater than 0 and no more than 1000. The ratio $R_{V\text{-}H}$ is calculated based on the simultaneous supply amount of the group V additional halogen-based gas and the nitrogen source gas. $R_{V\text{-}H}$ may be calculated based on the mass flow rate (mass of substance that passes through the area given per unit time) generally used for control of the gas supply amount in a crystal growth apparatus. For example, when ammonia gas flows as the nitrogen source gas in an amount of 100 sccm, and simultaneously a hydrogen chloride gas flows as the group V additional halogen-based gas in an amount of 100 sccm, the molar amount of nitrogen atoms is also worth 100 sccm, and the molar amount of chloride atoms is also worth 100 sccm, whereby $R_{V\text{-}H}$ is calculated as 1. When the ratio $R_{V\text{-}H}$ is 0, the inhibition effect on the vapor-phase reaction becomes small, and the effect of reducing minute crystal defects in the group III nitride single crystal is not obtained. If the ratio $R_{V\text{-}H}$ is over 1000, the reaction of the nitrogen source gas and the group III source gas becomes difficult to progress, and the growth rate of the group III nitride single crystal tends to decrease. Considering the effect of reducing adhesion particles and minute crystal defects, and the growth rate of the group III nitride single crystal, the ratio $R_{V-H}$ is preferably 0.05 to 100, and more preferably 0.1 to 50.

The apparatus for manufacturing a group III nitride single crystal of the present invention may be especially preferably used when an aluminum nitride single crystal, whose source supply amount tends to be a lot because the growth rate of the crystal is fast, is manufactured by HVPE. The reason of this is considered as that the reaction of an aluminum chloride gas which is the group III source gas and ammonia gas which is the nitrogen source gas is generally fast and has irreversibility. In growing a gallium nitride crystal or an indium nitride crystal, the nitride crystal itself is relatively low in temperature and easily has a thermal decomposition, and the nitride crystal reacts with a hydrogen halide gas in the atmosphere and a hydrogen gas which is often used as a carrier gas, to chemically changes again to a chloride and a hydride. Therefore, the apparent generation ratio of the nitride crystal is relatively slow, and the reaction is invertible. The aluminum nitride crystal is poor in such a property. Therefore, in growing an aluminum nitride crystal, the reaction area 10 needs to be precisely controlled in a manner to inhibit the generation of group III nitride fine particles by the reaction of the group III source gas and the nitrogen source gas in the vapor phase in the reaction area, and to inhibit the introduction of minute crystal defects in the group III nitride single crystal.

In the above explanation regarding the present invention, the vapor deposition apparatus 100 in which the group III source gas supply nozzle 24 is arranged inside the reaction vessel 11 as a single pipe is shown. However, the present invention is not limited to this configuration. For example, a flow pass (not shown) of barrier gas may be formed outside of the flow pass of the group III source gas in a manner to cover the outer periphery of the group III source gas supply nozzle 24, and a barrier gas outlet may be formed in a manner to surround the group III source gas supply nozzle outlet 25. As the barrier gas, for example, general barrier gases, such as hydrogen, nitrogen, argon, and helium may be used without particular limitations. The barrier gas makes it possible to control the position at which the group III source gas and the nitrogen source gas are mixed in the reaction area 10, and to prevent the mixing and reaction of the nitrogen source gas and the group III source gas at unintentional points from occurring, whereby it is possible to considerably inhibit the deposition of adhered substances on the nozzle. The shaft center of the group III source gas supply nozzle 24 (the center position of the nozzle in the height direction) may be offset (shifted) in the height direction to the shaft center of the barrier gas nozzle, as long as the offset does not affect the crystal growth.

The group III nitride single crystal manufacturing apparatus 100 may have a structure to supply an extruding gas. That is, an extruding gas inlet 14 to introduce an extruding gas into the reaction vessel 11 may be arranged, in such a manner that the group III source gas, the nitrogen source gas, and the barrier gas evenly flow to the exhaust outlet 15 without flowing back in the reaction vessel 11. As the extruding gas, for example, general gases such as hydrogen, nitrogen, argon, and helium may be used. Further, a structure to decompress and exhaust the inside of the reaction vessel 11 may be arranged on a further downstream side of the exhaust outlet 15, to inhibit the gas flow inside the reaction vessel 11 from flowing back. The pressure inside the reaction vessel 11 may be selected in a manner not to badly affect the crystal growth. The pressure inside the reaction vessel 11 is normally 0.1 to 1.5 atm, and generally 0.2 to an atmospheric pressure. For the same purpose, a current plate as described in Patent Literature 5 may be arranged in the apparatus.

The shapes of the cross sections of the nitrogen source gas outlet 33 and the group III source gas supply nozzle outlet 25 are not particularly limited, and may be freely selected, such as circle, oval, and rectangular, in accordance with the size of the substrate.

<2. Method for Manufacturing Group III Nitride Single Crystal>

The method for manufacturing a group III nitride single crystal according to the second aspect of the present invention includes the step of supplying a group III source gas and a nitrogen source gas to the reaction area of the apparatus for manufacturing a group III nitride single crystal according to the first aspect of the present invention, such that the group III source gas and the nitrogen source gas react (hereinafter may be simply referred to as step (a)). In the step (a), a group III nitride single crystal is grown by the reaction of the group III source gas and the nitrogen source gas. In the step (a), the nitrogen source gas and the halogen-based gas are supplied to the reaction area from the nitrogen source gas supply nozzle.

Hereinafter, a configuration in which the above-described group III nitride single crystal manufacturing apparatus 100 is explained as an example, as the apparatus for manufacturing a group III nitride single crystal according the first aspect of the present invention.

As the group III source gas supplied from the group III source gas supply nozzle 24 in the group III nitride single crystal manufacturing apparatus 100 (see FIG. 1), group III halide gases such as: aluminum halide such as aluminum chloride and aluminum bromide; gallium halide such as gallium chloride; indium halide such as indium chloride, and group III organic metal compound gases such as trimethylaluminum and trimethylgallium may be used without particular limitations. In manufacturing a mixed crystal, a mixture gas containing a plurality of group III source gases is used. When HVPE is employed, the group III metal source 22 is arranged in the source part reaction vessel 21 on the upstream side of the group III source gas supply nozzle 24, as described above, and a halogen-based gas (e.g. hydrogen chloride gas and chloride gas) is supplied to the source part reaction vessel 21, while the source part reaction vessel 21 is heated (for example, when an aluminum chloride gas is generated, normally around 150 to 1000° C., preferably around 300 to 660° C., and more preferably around 300 to 600° C., and when a gallium chloride gas is generated, normally around 300 to 1000° C.) by the outer heater 16, to generate a group III halide gas in the source part reaction vessel 21, whereby it is possible to introduce the group III halide gas into the reaction area 10 via the group III source gas supply nozzle 24.

The group III additional halogen-based gas confluence part 27 may be arranged at a free-selected position in a portion from the group III source gas supply nozzle 24 to the source part reaction vessel 21, to join the group III additional halogen-based gas to the group III source gas. The group III additional halogen-based gas is a halogen-based gas (e.g. hydrogen chloride gas and chloride gas). By joining the halogen-based gas to the group III halide gas generated inside the source part reaction vessel 21, it is possible to freely control the gas composition ratio of the group III halide gas and the halogen-based gas. The supply of the group III additional halogen-based gas is optional. However, when a gallium halide gas is used as the group III source gas to manufacture a gallium nitride single crystal, the ratio of simultaneous supply amount of the group III additional halogen-based gas and the gallium halide gas:

(a molar amount of halogen atoms in the group III additional halogen-based gas)/(a molar amount of halogen atoms in the gallium halide gas)

is preferably 0.01 to 10 and more preferably 0.05 to 1. When an aluminum halide gas is used as the group III source gas to grow an aluminum nitride single crystal, the ratio of simultaneous supply amount of the group III additional halogen-based gas and the aluminum halide gas:

(a molar amount of halogen atoms in the group III additional halogen-based gas)/(a molar amount of halogen atoms in the gallium halide gas)

is preferably 0.1 to 1000 and more preferably 0.5 to 100. The calculation of the above ratio may be carried out based on the mass flow rate (mass of substance that passes through the area given per unit time) generally used for control of the gas supply amount in a crystal growth apparatus. By the coexistence of the group III additional halogen-based gas and the group III source gas, it is possible to inhibit the deposition of group III metal for example by a disproportional reaction of aluminum chloride gas and gallium chloride gas.

In place of the source part reaction vessel 21 having a configuration in which the group III metal material is arranged, a group III source supply part having a configuration in which a group III source gas separately produced (when HVPE is employed, a group III halide gas, when MOCVD is employed, a group III organic metal compound gas) is supplied, and the gas is heated to a desirable temperature (e.g. room temperature to 200° C.) by a heater may be employed.

These group III source gas and group III additional halogen-based gas are normally supplied in a diluted state by a carrier gas. As the carrier gas, hydrogen gas, nitrogen gas, helium gas, argon gas, and a mixture gas thereof may be used without particular limitations. It is preferable to use a carrier gas including hydrogen gas. When the group III source gas is diluted with the carrier gas to be supplied, the concentration of the group III source gas may be 0.0001 to 10 volume %, on the basis of the total amount of the group III source gas and the carrier gas to dilute the group III source gas (100 volume %), for example. The supply amount of the group III source gas may be 0.005 to 500 sccm for example. As described later, it is preferable that the group III source gas is supplied in the reaction area 10 (onto the substrate 12) after the supply of the halogen-based gas onto the substrate 12 is started.

In order to azotize the group III source gas, which is introduced from the source part reaction vessel 21 to the reaction area 10 via the group III source gas supply nozzle 24, to obtain a group III nitride single crystal, the nitrogen source gas is introduced from the nitrogen source gas inlet 31 to the reaction area 10 via the nitrogen source gas supply nozzle 32. This nitrogen source gas is normally supplied in a diluted state with a carrier gas. As the nitrogen source gas, a reactive gas containing nitrogen may be used without particular limitations, and in view of cost and easy handling, ammonia gas may be preferably used. As the carrier gas, hydrogen gas, nitrogen gas, helium gas, argon gas, and a mixture gas thereof may be used without particular limitations, and a carrier gas containing hydrogen gas may be preferably used. When the nitrogen source gas is supplied to the reaction area 10 in a diluted state with a carrier gas, the supply amount of the nitrogen gas and the supply amount of the carrier gas may be determined based on the size of the apparatus and the like. Considering the easiness of the manufacturing of the group III nitride single crystal and the like, the supply amount of the carrier gas is preferably 50 to 10000 sccm and more preferably 100 to 5000 sccm. The concentration of the nitrogen source gas may be, for example, 0.0000001 to 10 volume %, based on the total amount of the nitrogen source gas and the carrier gas to dilute the nitrogen source gas (100 volume %). The supply amount of the nitrogen source gas may be 0.01 to 1000 sccm for example. The order to supply the nitrogen source gas onto the substrate 12 is not particularly limited, and as described later, it is preferable that the nitrogen source gas is supplied in the reaction area 10 (onto the substrate 12) before the halogen-based gas and the group III source gas are supplied in the reaction area 10 (onto the substrate 12).

In the apparatus 100, the junction 35 is arranged at a free-selected point in the portion from the nitrogen source gas inlet 31 to the nitrogen source gas outlet 33. The group V additional halogen-based gas is introduced from the group V additional halogen-based gas inlet nozzle 34, joins to the nitrogen source gas supplied from the nitrogen source gas inlet 31 at the junction 35, and supplied to the reaction area 10 from the nitrogen source gas outlet 33 with the nitrogen source gas. Preferable embodiments of the temperature on the downstream side of the junction 35, the temperature on the upstream side of the junction 35, supply amount of the group V additional halogen-based gas to join to the nitrogen source gas, and the like have been already explained in the above-described (<1. Apparatus for manufacturing group III nitride single crystal>).

It is preferable to start the supply of the halogen-based gas to the reaction area 10 before the group III source gas is supplied to the reaction area 10. More specifically, it is preferable to start the supply of the halogen-based gas onto the substrate 12 before the group III source gas is supplied onto the substrate 12. That is, it is preferable to start the supply of the halogen-based gas onto the substrate 12 before the group III source gas and the nitrogen source gas are supplied onto the substrate 12 and react with each other. By starting the supply of the halogen-based gas onto the substrate 12 before the group III source gas is supplied onto the substrate 12, it is possible to reduce variations in quality of the group III nitride single crystal to be manufactured, and to stably manufacture group III nitride single crystals of good quality, in a method for manufacturing a group III nitride single crystal including the step of repeating the step (a) using the same apparatus for manufacturing the group III nitride single crystal, such that a plurality of group III nitride single crystals are produced (step (b)). The halogen-based gas supplied before the group III source gas is supplied may be the group V additional halogen-based gas, may be the group III additional halogen-based gas, and may be both of them.

When the supply of the halogen-based gas onto the substrate 12 starts before the group III source gas is supplied onto the substrate 12, the time from when the halogen-based gas is ejected from the outlet of the nozzle until when the halogen-based gas is supplied onto the substrate 12 may be obtained by dividing the volume inside the reaction vessel 11 from the outlet portion of the nozzle to supply the halogen-based gas (in the apparatus 100 of FIG. 1, the nitrogen source gas outlet 33 or the group III source gas outlet 25) to the substrate 12 ($cm^3$; in the apparatus 100 of FIG. 1, the volume of a prior supply gas calculation area in reaction area 36) by the supply amount of the halogen-based gas (alternatively, when the halogen-based gas is simultaneously supplied with another gas such as carrier gas, the total supply amount of the halogen-based gas and another gas) (cm³/min). The time from when the introduction of the halogen-based gas is started until when the halogen-based gas reaches the outlet of the nozzle may be obtained by dividing the total volume inside the pipe to form the movement path of the halogen-based gas from the inlet of the nozzle to introduce the halogen-based gas to the outlet of the halogen-based gas by the supply flow amount of the halogen-based gas (alternatively, when the halogen-based gas and another gas such as carrier gas are simultaneously supplied from the same pipe, the total supply amount of the halogen-based gas and another gas). By starting the supply of the group III source gas after the time calculated by this method passes after the introduction of the halogen-based gas inside the reaction vessel 11 is started, it is possible to surely supply the halogen-based gas onto the substrate 12 before the group III source gas is supplied onto the substrate 12.

The supply amount of the halogen-based gas under standard state conditions before the group III source gas is supplied (sccm; hereinafter referred to as "$V_{H0}$") is not particularly limited, and the absolute amount may be determined based on the size of the apparatus and the like. In view of making the change in gas flow immediately after the growth of crystal starts small and manufacturing group III nitride single crystal of stable quality, it is preferable that the halogen-based gas is continuously supplied not only before the supply of the group III source gas is started but also after the supply of the group III source gas is started, and it is also preferable that the supply amount (absolute amount) of the halogen-based gas does not change even after the supply of the group III source gas is started. That is, when the supply amount of the halogen-based gas under standard state conditions after the supply of the group III source gas is started is set as $V_H$ (sccm), $V_{H0}=V_H$ is preferable. $V_{H0}$ and $V_H$ are determined as the total amount of all of the supplied halogen-based gas. By making the change of gas flow small, it becomes easy to reproduce the same gas atmosphere in repeatedly manufacturing a plurality of group III nitride singe crystals. Therefore, it becomes easy to reduce the variations in quality of the plurality of group III nitride single crystals to be manufactured. Similarly, when the nitrogen source gas is supplied before the group III source gas is supplied, it is preferable that the supply amount (absolute amount) of the nitrogen source gas does not change before and after the supply of the group III source gas.

The supply amount of the halogen-based gas in supplying the group III source gas is not particularly limited. In view of increasing the crystal quality of the group III nitride single crystal to be finally obtained, the halogen-based gas and the group III source gas are supplied such that the fraction of the halogen-based gas when the crystal grows ($H_{epi}=V_H/(V_H+V_{III})$) satisfies the following formula (1):

$$0.5 \leq V_H/(V_H+V_{III}) < 1.0 \tag{1}$$

(in the formula (1), $V_H$ represents a supply amount of the halogen-based gas under standard state conditions (sccm); and $V_{III}$ represents a supply amount of the group III source gas under standard state conditions (sccm).).

In the formula (1), $V_H$ and $V_{III}$ show supply amounts at the same time.

With the supply of the halogen-based gas in such a manner that the fraction of the halogen-based gas ($H_{epi}$) satisfies the formula (1), it is possible to drastically decrease the equilibrium partial pressure of a monohalide gas of group III element (e.g. aluminum monohalide gas). As a result, it is possible to manufacture a single crystal of higher quality (for example, when an aluminum nitride single crystal is grown, a single crystal in which the number of bright spots existing on a reflect X-ray topography image of a (114) plane is reduced is made). Considering the crystal quality and industrial production such as growth rate, the fraction of the halogen-based gas ($H_{epi}$) is preferably no less than 0.55 and less than 1.0, and more preferably no less than 0.6 and less than 1.0.

When the group III source gas is obtained by the reaction of: a metal aluminum or organic metal gas; and a halogen-based gas for source generation, it is also possible to generate a mixture gas of the group III source gas and the halogen-based gas by controlling the reaction rate of the metal aluminum or organic metal gas and the halogen-based gas for source generation in such a manner that unreacted gas is made remained purposely, and to supply the mixture gas in the reaction area 10.

Generally, when a group III halide gas is used as the group III source gas, that is, when the group III nitride single crystal is grown by HVPE, with which a high growth rate is obtained, deposits tend to attach to the nozzle, and minute crystals tend to be generated. This tendency is remarkably found especially when an aluminum halide gas of fast reaction rate is used. Because of this, the apparatus for manufacturing a group III nitride single crystal and the method for manufacturing a group III nitride single crystal of the present invention may be preferably used when a group III nitride single crystal is grown by HVPE, and especially preferably used when a group III nitride single crystal including aluminum as a group III element (hereinafter may be referred to as "Al-based group III nitride") is grown by HVPE, and most preferably used when an aluminum nitride single crystal is grown by HVPE. In this view point, in the method for manufacturing a group III nitride single crystal of the present invention, it is preferable that the group III source gas is a group III halide gas and the nitrogen source gas is ammonia gas, and it is especially preferable that the group III source gas is an aluminum halide gas. When the group III source gas is an aluminum halide gas, the supply amount of the aluminum halide gas may be 0.001 to 100 sccm for example. In the growth of an aluminum nitride single crystal by HVPE, the effect of the present invention is remarkably provided when the growth rate is no less than 5 μm/h, preferably no less than 10 μm/h, and especially preferably over 15 μm/h. The upper limit value of the growth rate is not particularly limited, and considering industrial production, it may be no more than 200 μm for example, and preferably no more than 100 μm. When a heater for the substrate 12 is provided outside, the upper limit value may be no more than 300 μm/h for example.

In the reaction area 10 of the group III nitride single crystal manufacturing apparatus 100, a barrier gas flow may be interposed between the flow of the group III halide gas (group III source gas) from the group III source gas supply nozzle 24 and the flow of the nitrogen source gas from the nitrogen source gas supply nozzle 32. As the barrier gas to flow between the flow of the group III source gas and the flow of the nitrogen source gas, a nitrogen gas, an argon gas, and a mixture gas thereof may be preferably used, because they are inert gases, and they have large molecular weights, therefore the group III source gas and the nitrogen source gas are slow to diffuse in such barrier gases (having high barrier effect). In order to adjust the effect of the barrier gas, an inert (that is, does not react with the group III source gas and the nitrogen source gas) low molecular weight gas, such as hydrogen gas, helium gas, and neon gas, may be mixed with nitrogen gas, argon gas, and a mixture gas thereof. The supply amount of the barrier gas is determined based on the size of the apparatus and the effect of the inhibition of mixing, and not particularly limited. The supply amount may be 50 to 10000 sccm for example, and preferably 100 to 5000 sccm for example.

As the material of the substrate 12 on which the group III nitride single crystal deposits, for example sapphire, silicon, silicon carbide, zinc oxide, gallium nitride, aluminum nitride, aluminum gallium nitride, gallium arsenide, boronized zirconium, boronized titanium, and the like may be used without particularly limitations. The thickness of the base substrate is not particularly limited either, and may be 100 to 2000 μm for example. The plane orientation of the crystal of the substrate 12 is not particularly limited either, and for example it may be +c plane, −c plane, m plane, a plane, and r plane.

In order to remove organic compounds attached to the substrate 12 before the group III source gas and the nitrogen source gas are reacted, it is preferable to carry out a thermal cleaning by heating the substrate 12 via the susceptor 13, with a flow of a carrier gas including hydrogen gas in the reaction area 10. The thermal cleaning of the substrate 12 is generally carried out with the substrate kept at 1100° C. for around 10 minutes, and the conditions may be adequately changed depending on the material of the substrate 12. For example, when a sapphire substrate is used as the substrate 12, the substrate 12 is generally kept at 1100° C. for around 10 minutes.

After that, the group III source gas is introduced to the reaction area 10 via the group III source gas supply nozzle 24, and the nitrogen source gas is introduced to the reaction area 10 via the nitrogen source gas supply nozzle 32, whereby a group III nitride single crystal is grown on the heated substrate 12. At this time, as described above, it is preferable to start the supply of the group III source gas after the halogen-based gas is supplied on the substrate 12, to react the group III source gas and the nitrogen source gas and start the crystal growth. The supply of the nitrogen source gas, the group III source gas and the halogen-based gas may be, for example, (i) in the order of the nitrogen source gas, the halogen-based gas, and the group III source gas, (ii) in the order of the halogen-based gas, the nitrogen source gas, and the group III source gas, and (iii) in the order of the halogen-based gas, the group III source gas, and the nitrogen source gas. When (i) is employed, the nitrogen source gas and the halogen-based gas may be simultaneously supplied. When (ii) or (iii) is employed, the nitrogen source gas and the group III source gas may be simultaneously supplied. Among them, in view of preventing the crystal growth plane of the substrate 12 from decomposing, the supply order of (i) may be preferably employed. That is, it is preferable that the step (a) includes the successive steps of beginning to supply the nitrogen source gas onto the substrate, beginning to supply the halogen-based gas onto the substrate, and beginning to supply the group III source gas onto the substrate.

The heating temperature of the substrate 12 when the crystal grows is preferably 1000 to 1700° C. when HVPE is employed, especially preferably 1200 to 1650° C. when an aluminum nitride single crystal is manufactured by HVPE, and preferably 1000 to 1600° C. when MOCVD is employed. The growth of the group III nitride single crystal in the method for manufacturing a group III nitride single crystal of the present invention is normally carried out under a pressure around atmospheric pressure (that is, under the conditions that each pressure inside the reaction vessel, inside the group III source gas supply nozzle, and inside the nitrogen source gas supply nozzle is 0.1 to 1.5 atm. When an aluminum nitride single crystal is manufactured, preferably under the condition that the pressure is 0.2 atm to atmospheric pressure) when HVPE is employed (that is, a group III halide gas is used as the group III source gas). When MOCVD is employed (that is, a group III organic metal compound gas is used as the group III source gas), normally the growing is carried out under a pressure of 100 Pa to atmospheric pressure.

When HVPE is used, the supply amount of the group III source gas (group III halide gas) is normally 1 Pa to 1000 Pa in terms of supply partial pressure (ratio of volume of the group III source gas under standard state conditions to the total volume of all the gases to be supplied (carrier gas, group III source gas, nitrogen source gas, barrier gas, and extruding gas) under standard state conditions. When MOCVD is employed, the supply amount of the group III source gas (group III organic metal compound gas) is normally 0.1 to 100 Pa in terms of supply partial pressure. The supply amount of the nitrogen source gas is not particularly limited, and generally 0.5 to 1000 times and preferably 1 to 200 times of the supply amount of the above group III source gas.

In the process of growing the group III nitride single crystal, it is possible to control the orientation of crystal growth to be in +c axis direction, −c axis direction, m axis direction, a axis direction, and the like, by controlling the electric conductivity of the crystal to be n-type or p-type, or to be semi-insulative by doping the crystal with an element having a different valence from that of group III elements and group V elements to which nitrogen belongs, or by making the doping impurities function as a surfactant in the growth of the group III nitride single crystal. As the dopant, molecules including elements such as C, Si, Ge, Mg, O and S may be used without particular limitations.

The growth time may be adequately adjusted to achieve a desired growth film thickness. After the crystal growth is carried out for a predetermined time, the supply of the group III source gas is stopped to finish the crystal growth. After that, the substrate 12 is cooled down to the room temperature. By this procedure, it is possible to grow a group III nitride single crystal on the substrate 12.

The apparatus for manufacturing a group III nitride single crystal and the method for manufacturing a group III nitride single crystal of the present invention are not particularly limited, and preferably used when a group III nitride single crystal of no less than 20 μm in film thickness, especially an aluminum nitride single crystal of no less than 20 μm in film thickness, is grown on a substrate, and especially preferably used when a group III nitride single crystal of no less than 100 μm in film thickness, especially an aluminum nitride single crystal of no less than 100 μm in film thickness, is grown on a substrate. The upper limit of the film thickness of the group III nitride single crystal is not particularly limited, and may be no more than 2000 μm for example. The size of the group III nitride single crystal, especially the size of the aluminum nitride single crystal, is not particularly limited. The larger the size is, the more remarkably the effect of reducing adhesion particles and minute crystal defects is obtained. Therefore, the size of the group III nitride single crystal, especially the size of the aluminum nitride single crystal, is preferably no less than 100 mm$^2$, more preferably no less than 400 mm$^2$, and further preferably no less than 1000 mm$^2$, as the area with which the group III nitride single crystal is grown on the substrate (area of crystal growth plane). The upper limit value of the crystal growth plane is not particularly limited, and may be no more than 10000 mm² for example.

<3. Aluminum Nitride Single Crystal>

As described above, the apparatus for manufacturing a group III nitride single crystal and the method for manufacturing a group III nitride single crystal of the present invention are suitable for manufacturing an aluminum nitride single crystal. For example, by using the group III nitride single crystal manufacturing apparatus 100, the group V additional halogen-based gas reduces the progression of the reaction of the group III source gas and the nitrogen source gas in the reaction area 10, whereby it is possible to effectively inhibit the reaction of both gases in the vapor phase and generation of fine particles in the group III nitride single crystal. As a result, in the group III nitride single crystal to be obtained, it is possible to reduce adhesion particles (particles of 0.05 to 2.0 mm in thickness and 1 to 200 μm in maximum outer diameter observed by a Nomarski differential interference contrast microscope) and minute crystal defects. Therefore, it is possible to manufacture an aluminum nitride single crystal in which the minute crystal defects are reduced, even though the aluminum nitride single crystal is manufactured by HVPE with which the reactivity of the source gas is high and it is difficult to grow a high quality crystal. Specifically, it is possible to manufacture an aluminum nitride single crystal whose number density of bright spots existing in a reflection X-ray topography image of a (114) plane (hereinafter may be simply referred to as "bright spots") is 0 to 20 cm$^{-2}$. The number density of the adhesion particles in the aluminum nitride single crystal is preferably 0 to 20/cm².

By using the above-described apparatus for manufacturing a group III nitride single crystal, it is possible to manufacture a high-quality aluminum nitride single crystal of 0 to 20 cm$^{-2}$ in number density of bright spots and of no less than 100 mm² in area of the crystal growth plane. The number of adhesion particles in the aluminum nitride single crystal is preferably no less than 0 to 20/cm². The area of the crystal growth plane is preferably no less than 100 mm², and the upper limit value thereof is not particularly limited. The larger the area is, the more advantageous industrially the crystal is. Considering industrial production, the area of the crystal growth plane is preferably no more than 10000 mm². The thickness of the aluminum nitride single crystal is not particularly limited, and preferably 20 to 3000 μm.

The aluminum nitride single crystal of the present invention may have a corrected absorption coefficient at a wavelength of 265 nm $\alpha_{265}$ of no less than 0 cm$^{-1}$ and less than 20 cm$^{-1}$, by reducing the bright spots. Further, it may also have a corrected absorption coefficient at a wavelength of 220 nm $\alpha_{220}$ of no less than 0 cm$^{-1}$ and less than 20 cm$^{-1}$. Here, the corrected absorption coefficients $\alpha_{265}$ and $\alpha_{220}$ mean $\alpha_{265}$ and $\alpha_{220}$ in the formulas representing the linear light transmittances of a plate sample:

$$T_{265}=(1-R_{265})^2\exp(-\alpha_{265}x)/\{1-R_{265}^2\exp(-2\alpha_{265}x)\} \quad (2a)$$

$$T_{220}=(1-R_{220})^2\exp(-\alpha_{220}x)/\{1-R_{220}^2\exp(-2\alpha_{220}x)\} \quad (2b)$$

In the formulas (2a) and (2b), $T_{265}$ and $T_{220}$ are linear light transmittances at wavelengths of 265 nm and 220 nm respectively, x is a plate thickness (cm), and $R_{265}$ and $R_{220}$ are the reflectance at the wavelengths of 265 nm and 220 nm respectively. In the present description, the corrected absorption coefficient at a wavelength of 265 nm of the aluminum nitride single crystal $\alpha_{265}$ is a value calculated as the solution of the formula (2a) in which $R_{265}$=0.160. The corrected absorption coefficient at a wavelength of 220 nm of the aluminum nitride single crystal $\alpha_{220}$ is a value calculated as the solution of the formula (2b) in which $R_{220}$=0.218.

The aluminum nitride single crystal of the present invention may be manufactured by the apparatus for manufacturing a group III nitride single crystal according to the first aspect of the present invention, for example, by the group III nitride single crystal manufacturing apparatus 100 described above, that is, an apparatus in which the nitrogen source gas and the halogen-based gas are supplied from the nitrogen source gas supply nozzle 32 to the reaction area. The reason of this is presumed as follows. When a group III nitride single crystal is manufactured by a conventional apparatus, the group III source gas and the nitrogen source gas are easy to be mixed in the reaction area 10, and fine particles of group III nitride crystal is generated by the vapor-phase reaction in the reaction area. It is considered that the fine particles attach to the substrate 12, whereby minute crystal defects (bright spots observed in a reflection X-ray topography image of a (114) plane) increases. It is considered that this phenomenon is especially remarkable when a nitride crystal including aluminum is manufactured from a source gas including aluminum, which has a high reactivity. It is considered, when the vapor-phase reaction in the reaction area becomes remarkable, not only minute crystal defects increase in the group III nitride single crystal, but also fine particles generated in the reaction area grow as particles to be grown particles, whereby deposits of the grown particles increase in the apparatus and the number of the grown particles to be attached to the substrate plane on which the crystal is growing increases. In conventional techniques, the generation of adhesion particles itself (attachment of grown particles to the substrate plane) is inhibited to reduce crystal defects caused by the adhesion particles, by adjusting the gas flow in the apparatus for manufacturing a group III nitride single crystal with a current plate (described in Patent Literature 5), barrier gas flow, and the like. However, it is considered that in conventional techniques, it is not possible to control the vapor-phase reaction occurred in a finer scale than the grown particles, and minute crystal defects cannot be reduced. According to the apparatus for manufacturing a group III nitride single crystal according to the first aspect of the present invention, it is considered that the group V additional halogen-based gas reduces the progression of the reaction of the group III source gas and the nitrogen source gas, to effectively inhibit both of the reaction of the gases in the vapor phase and the generation of group III nitride single crystal fine particles. In the apparatus for manufacturing a group III nitride single crystal and the method for manufacturing a group III nitride single crystal of the present invention, the group V additional halogen-based gas, which is not considered to be good to mix with the nitrogen source gas under normal circumstances, is supplied in the reaction area 10 in a coexisting state with the nitrogen source gas. It is considered that this effectively block the reaction of the group III source gas and the nitrogen source gas in the reaction area 10, and the effect of inhibiting generation of fine particles is remarkably obtained.

For example, when a chemomechanical polishing (CMP) is carried out on a group III nitride single crystal substrate manufactured by an apparatus for manufacturing a group III nitride single crystal provided with a current plate, thereafter the polished surface is evaluated by reflection X-ray topography, bright spots considered as crystal defects are observed. When the bright spots are observed in detail, it was found that the bright spots do not correspond to the exiting points of adhesion particles. The observation results show that the bright spots observed by reflection X-ray topography correspond to minute crystal defects which are different from adhesion particles.

Such minute crystal defects are not observed by a Nomarski differential interference contrast microscope (optical microscope) which is used for conventional evaluation methods, and are able to be observed firstly by reflection X-ray topography. The crystal defects observed as bright spots in a reflection X-ray topography image of a (114) plane of the aluminum nitride single crystal are minute defects, therefore it is difficult to be distinguished by a method of observing the average property of crystal (substrate), such as X-ray rocking curve measurement. With a method of observing pits formed in parts of the crystal defects by etching the CMP surface by an acid or base (etch pit), the number of defects is overevaluated because even dislocations (crystal defects smaller than the defects observed as bright spots in the present invention) become pits. The crystal defects observed as bright spots in the reflection X-ray topography image is different from the dislocations classified as edge dislocations and screw dislocations.

For the evaluation of crystal defects by X-ray topography, an evaluation of transmission system is generally used. In the transmission system, the substrate is irradiated with a high-intensity X-ray, to obtain diffractions at a crystal face in the substrate, thereafter diffraction X-rays that transmit the substrate are formed as an image. Therefore, if crystal defects exist over the substrate, the diffraction X-rays reinforce each other or weaken each other, or simply scatter to be weak, as a result, an image formation contrast is made at portions of crystal defects. The reason of the use of reflection X-ray topography for the evaluation of the aluminum nitride single crystal according to the third aspect of the present invention is that the defects on the outermost surface of the substrate affect the functions of light emitting devices and electronic devices, when a layer structure that functions as the light emitting devices and electronic devices are formed on the aluminum nitride single crystal substrate. For example, when light emitting devices are formed on the aluminum nitride single crystal substrate, failures such as current leaking are brought by the crystal defects on the substrate surface. The crystal defects to badly affect the expression of function of layer structure formed on the aluminum nitride single crystal substrate are mainly crystal defects existing near the substrate surface, which are observed by reflection X-ray topography. It is not possible to properly evaluate the crystal defects near the substrate surface, because the observation by transmittance X-ray topography evaluates the substrate including the entirety inside the substrate.

In a transmission X-ray topography, generally a high-intensity and expensive X-ray source, such as synchrotoron radiation and rotating anticathode X-ray, is needed. In reflection X-ray topography, it is possible to sufficiently evaluate bright spots with cheap light sources of relatively low intensity using X-ray tube bulb made of copper target, whereby it is possible to reduce evaluation cost. Needless to say, it is also possible to evaluate bright spots with rotation anticathode X-ray and synchrotoron radiation as X-ray source used as transmission system.

The bright spots correspond to the crystal defects observed in an observation of a diffraction image for example from a (114) plane of the aluminum nitride single crystal substrate by reflection X-ray topography. When the (114) plane is observed, the bright spots are observed as a result of reinforced diffraction of the defect parts. When the diffraction plane to be measured is changed, the defect parts may be observed as dark spots. For example, when reflection X-ray topography is carried out with diffraction of a (105) plane and (214) plane, the defect parts are shown as dark spots. In an examination by the inventors of the present invention, it is confirmed that the positions of the bright spots obtained by the measurement of a (114) plane and the positions of the dark spots obtained by the measurement of a (105) plane are completely identical.

According to a method for manufacturing a group III nitride single crystal having a configuration in which the halogen-based gas is supplied onto the substrate 12 before the group III source gas is supplied, it is possible to reduce the variation in quality of group III nitride single crystal to be manufactured when a plurality of aluminum nitride single crystal is repeatedly manufactured by the same apparatus for manufacturing a group III nitride single crystal (that is, by batch type apparatus). In specific, it is possible to manufacture an aluminum nitride single crystal of 0 to 20 $cm^{-2}$ in average value of number density of bright spots existing in a reflection X-ray topography image of a (114) plane, 0 to 10 $cm^{-2}$ in standard deviation, 0 to 100% in standard deviation/average value. Further, in view of improving the yield of LED and electronic device, it is preferable that the average value of the number density of the bright spots is 0 to 5 $cm^{-2}$, the standard deviation is 0 to 2 $cm^{-2}$, and the standard deviation/average value is 0 to 60%.

The aluminum nitride single crystal of the present invention is preferably manufactured by HVPE. The chlorine content in the aluminum nitride single crystal manufactured by HVPE with aluminum chloride gas as the group III source gas is normally $1\times10^{12}$ to $1\times10^{19}$ $cm^{-3}$, and preferably $1\times10^{14}$ to $1\times10^{17}$ $cm^{-3}$. By having $1\times10^{12}$ to $1\times10^{19}$ $cm^{-3}$ of chlorine content, it is possible to obtain a high-quality aluminum nitride single crystal. The chlorine content in the aluminum nitride single crystal may be measured by a secondary ion mass spectrometry. The measurement of the chlorine content in the aluminum nitride single crystal by secondary ion mass spectrometry is carried out under the conditions of $Cs^+$ of primary ionic species and 15 kV of primary acceleration voltage.

(Use Application of Aluminum Nitride Single Crystal)

The aluminum nitride single crystal according to the third aspect of the present invention is suitably used as a growth substrate for light emitting diodes, substrate for light emitting diodes, and substrate for electronic devices. Specifically, the aluminum nitride single crystal of no less than 100 $mm^2$ in area of crystal growth face and no more than 20 $cm^{-2}$ in number density of bright spots observed by a reflection X-ray topography image of a (114) plane can improve the yield when light emitting diodes are manufactured by cutting a layered body (wafer) obtained by forming a light emitting diode layer on the aluminum nitride single crystal. By having an aluminum nitride single crystal of no more than 2 $cm^{-2}$ in standard deviation of number density of bright spots observed by a reflection X-ray topography image of a (114) plane and no more than 60% in standard deviation/average value, it is possible to predict the yield when the aluminum nitride single crystal is repeatedly manufactured, and the stock control becomes easy. Therefore, it is possible to prevent excess stock and stock shortage.

<4. Method for Manufacturing Wafer>

The method for manufacturing a wafer according to the fourth aspect of the present invention includes a step of forming a layer of light emission devices on the aluminum nitride single crystal according to the third aspect of the present invention. The layer structure of the light emission devices is not particularly limited, and a layer structure including a n-type layer, a p-type layer, and an active layer arranged between the n-type layer and the p-type layer may be given as an example. The active layer may be a layer having a quantum well structure, and a layer having a bulk heterojunction. As the semiconductor to form each layer of the layer of light emission devices, a group III nitride semiconductor may be especially preferably used. In forming the layer of light emission devices onto the surface of the aluminum nitride single crystal, a known crystal growth method such as MOCVD may be used without particular limitations.

<5. Method for Manufacturing Light Emitting Diode>

The method for manufacturing a light emitting diode according to the fifth aspect of the present invention includes: manufacturing a wafer by the method of manufacturing a wafer according to the fourth aspect, and cutting the wafer. In cutting the wafer, a known method, such as laser dicing, blade dicing, and stealth dicing, may be used without particular limitations.

EXAMPLES

Hereinafter the present invention will be explained in detail with Examples. However, the present invention is not limited to the following Examples. In Examples and Comparative Examples, examples in which an aluminum nitride single crystal was manufactured as the group III nitride single crystal are shown.

(Evaluation of Crystal Defect by Reflection X-Ray Topography)

For a measurement by reflection X-ray topography, a high-resolution thin film X-ray diffractometer (X'Pert Pro MRD manufactured by PANalytical B.V.) was used. From an X-ray tube bulb with Cu target, characteristic X-ray was generated under the conditions of 45 kV of acceleration voltage and 40 mA of filament current, whereby X-ray beam was taken out by line focus. The generated X-ray beam was a horizontal X-ray beam of high intensity by an X-ray mirror module (Goebel mirror). At this time, a ½° divergence slit (lateral limitation slit) and a vertical limitation slit of 50 μm in width were arranged at the entrance of the X-ray mirror module, to make the X-ray beam narrowed to approximately 1.2 mm in beam width. Thereafter, an aluminum nitride single crystal substrate, which was an object, arranged on the measurement stage, was irradiated with the X-ray beam. The CuKα1 line diffracted from a (114) plane of the aluminum nitride single crystal substrate was detected by a two-dimensional semiconductor X-ray detector (PiXcel 3D semiconductor detector manufactured by PANalytical B.V.), whereby a reflection X-ray topography image was obtained. The pixel size of the two-dimensional semiconductor X-ray detector was 256×256. Therefore, the substrate area measurable by one reflection X-ray topographic image was limited to approximately 8.4 mm in y direction and approximately 5.7 mm in x direction. Therefore, in order to measure a reflection X-ray topography image of entire plane of the substrate, the measurement of reflection X-ray photography image was repeated at different positions in the substrate plane with the measurement stage adequately shifted in x and y directions. The obtained reflection X-ray topography images of different positions in the substrate plane were pieced together, whereby a reflection X-ray topography image of the entire plane of the substrate was obtained. An image analysis was carried out on the obtained reflection X-ray topography image, to count the number of bright spots. The number of the bright spots was divided by the area of the aluminum nitride single crystal substrate, whereby the existence density of the bright spots per unit area ($cm^{-2}$) was calculated.

As the crystal plane of the aluminum nitride single crystal (substrate) to be measured, a (114) plane was chosen. This is because, according to the measurement of a (114) plane, it is possible to obtain sufficient resolution to observe the bright spots with the above-described apparatus. In addition to a (114) plane, measurements of a reflection X-ray topography image with a (103) plane and (105) plane may be carried out. However, when a reflection X-ray topography image of a (103) plane is obtained by means of the above-described apparatus for example, the resolution is insufficient, as a result the observation of the bright spots becomes unclear. Therefore, it is preferable to obtain a reflection X-ray topography image having a resolution higher than the resolution in the above-described measurement conditions. However, as long as the inventors of the present invention has examined, the upper limit of the resolution practical to measure the bright spots is around 10 μm×10 μm per pixel. If the measurement is carried out with a higher resolution than this, the measurement area of the reflection X-ray topography image per measurement becomes narrow, and it takes a long time to measure the entire plane of the substrate, which is not preferable. The diffraction conditions change by different measurement planes, therefore the bright spots may be observed as dark spots. The inventors of the present invention confirmed that the positions of the bright spots and the positions of the dark spots were identical with each other. When the crystal plane is curved in the substrate plane, and points satisfying the diffraction conditions and points out of the diffraction conditions exist in the substrate plane, it is preferable to identify the measurement shaft of the aluminum nitride single crystal in such a manner that the diffraction conditions are satisfied at each point.

A chemomechanical polishing (CMP) was carried out on the surface of the aluminum nitride single crystal substrate to obtain the reflection X-ray topography image, and the polishing damage layer of the surface was removed, whereby, the surface was finished into a condition in which no polishing damages and polishing scars were observed in the reflection X-ray topography image. The surface roughness was finished into a condition of no more than 0.15 nm as a root-mean-square roughness (RMS) when observed by an atomic force microscope of 5×5 μm² of visual field. If any polishing scars exist, the bright spots become unclear, whereby the evaluation of number density of the bright spots becomes difficult.

(Evaluation of Adhesion Particle)

By means of a Nomarski differential interference contrast microscope (LV150 manufactured by Nikon Corporation), a bright field observation was carried out with 100 to 500 of observation magnification on the surface of the aluminum nitride single crystal to be object immediately after the growth. The adhesion extraneous substances and defects of 0.05 to 2.0 mm in thickness and 1 to 200 μm in maximum outer diameter, existing on the surface and in the layer of the aluminum nitride single crystal layer were observed as adhesion particles. The number of the adhesion particles was obtained by observation of the entirety of main surface by the Normarski differential interface contrast microscope from the main surface side of the aluminum nitride single crystal layer, counting the number of the adhesion particles existing in the entirety of the substrate.

Example 1

(Growth of Aluminum Nitride Single Crystal Layer)
(Preparation of Base Substrate)

A commercially-available aluminum nitride single crystal substrate of 22 mm in diameter and 510 µm in thickness, manufactured by sublimation method, was used as a base substrate. An ultrasonic cleaning with acetone and isopropyl alcohol was carried out on the base substrate of aluminum nitride single crystal. Thereafter, the aluminum nitride single crystal substrate was set on a susceptor of BN coating graphite in a HVPE apparatus, in such a manner that the Al polar side of the aluminum nitride single crystal substrate came to the growth plane.

(Manufacturing Condition of Aluminum Nitride Single Crystal)

For the growth of the aluminum nitride single crystal layer, a HVPE apparatus of the configuration shown in FIG. 1 (group III nitride single crystal manufacturing apparatus 100), including a current plate arranged on the upstream side by 250 mm from the end of the group III source gas supply nozzle 24 in the flow channel was used. The current plate was a plate of quarts glass, in which 24 of through holes of 3 mm in diameter were provided. The current plate was welded to be arranged at the inner wall of the flow channel of quarts glass. The junction 35 of the group V additional halogen-based gas supply nozzle was heated to 400° C. by the source part heater 16, together with the nitrogen source gas supply nozzle 32 and the source part reaction vessel 21.

An extruding carrier gas was made to flow from a further upstream side of the flow channel, via the though holes of the current plate. As the extruding carrier gas, a mixture carrier gas of hydrogen and nitrogen mixed by 7:3 was used.

(Supply of Group III Source Gas)

A high purity aluminum of 6N grade, kept on a board of quarts glass, was arranged in the source part reaction vessel 21 on a further upstream side of the group III source gas supply nozzle 24. The inside of the source part reaction vessel 21 was heated to 400° C., and 16.8 sccm of hydrogen chloride gas was supplied with the carrier gas, whereby an aluminum chloride gas was generated. To the generated aluminum chloride gas, 1.1 sccm of hydrogen chloride gas was supplied from the group III additional halogen-based gas supply nozzle 26 via the group III additional halogen-based gas confluence part 27, whereby 1800 sccm in total of mixture gas including 1782. 1 sccm of mixture carrier gas of hydrogen and nitrogen was supplied. The mixture gas was introduced from the group III source supply nozzle outlet 25 to the reaction area 10.

(Supply of Nitrogen Source Gas: Addition of Group V Additional Halogen-based Gas)

From the nitrogen source gas supply nozzle 32, 31 sccm of ammonia gas, 3.1 sccm of hydrogen chloride gas ($R_{V-H}$=0.1), and 165.9 sccm of hydrogen carrier gas, that is, 200 sccm in total, were supplied to the reaction area. The mass flow rate of the extruding carrier gas supplied via the current plate was 6500 sccm. In addition, 1500 sccm of nitrogen gas was supplied from the barrier gas nozzle. The total flow amount of the gases supplied into the flow channel was 10000 sccm. The pressure in the system in the growth was kept at 0.99 atm.

(Temperature of Base Substrate and Growth of Aluminum Nitride Single Crystal)

The substrate 12 was heated to 1500° C. while the ammonia gas (mixture gas in which hydrogen chloride gas was added) was supplied from the nitrogen source gas supply nozzle 32 in accordance with the above conditions. After that, the aluminum chloride gas (mixture gas in which hydrogen chloride gas was added) was supplied from the group III source gas supply nozzle 24, whereby an aluminum nitride single crystal layer was grown for 11 hours. After the aluminum nitride single crystal layer was grown, the supply of the aluminum chloride gas and ammonia gas was stopped, and the substrate was cooled to the room temperature.

(Analysis on Aluminum Nitride Single Crystal Layer)

The obtained aluminum nitride single crystal layer had no fractures or cracks, and the thickness of the aluminum nitride single crystal layer was 396 µm. The thickness of the aluminum nitride single crystal layer was calculated by excluding the thickness of the aluminum nitride single crystal substrate, 510 µm, which was measured before the growth, from the total thickness of the aluminum nitride single crystal substrate after the growth, 906 µm. The adhesion of particles to the aluminum nitride single crystal layer was observed by the Normarski differential interface contrast microscope. The number density of the adhesion particles was 1 $cm^{-2}$. The X-ray rocking curve half-value width on a (002) plane was 16 arcsec.

Figure 2:
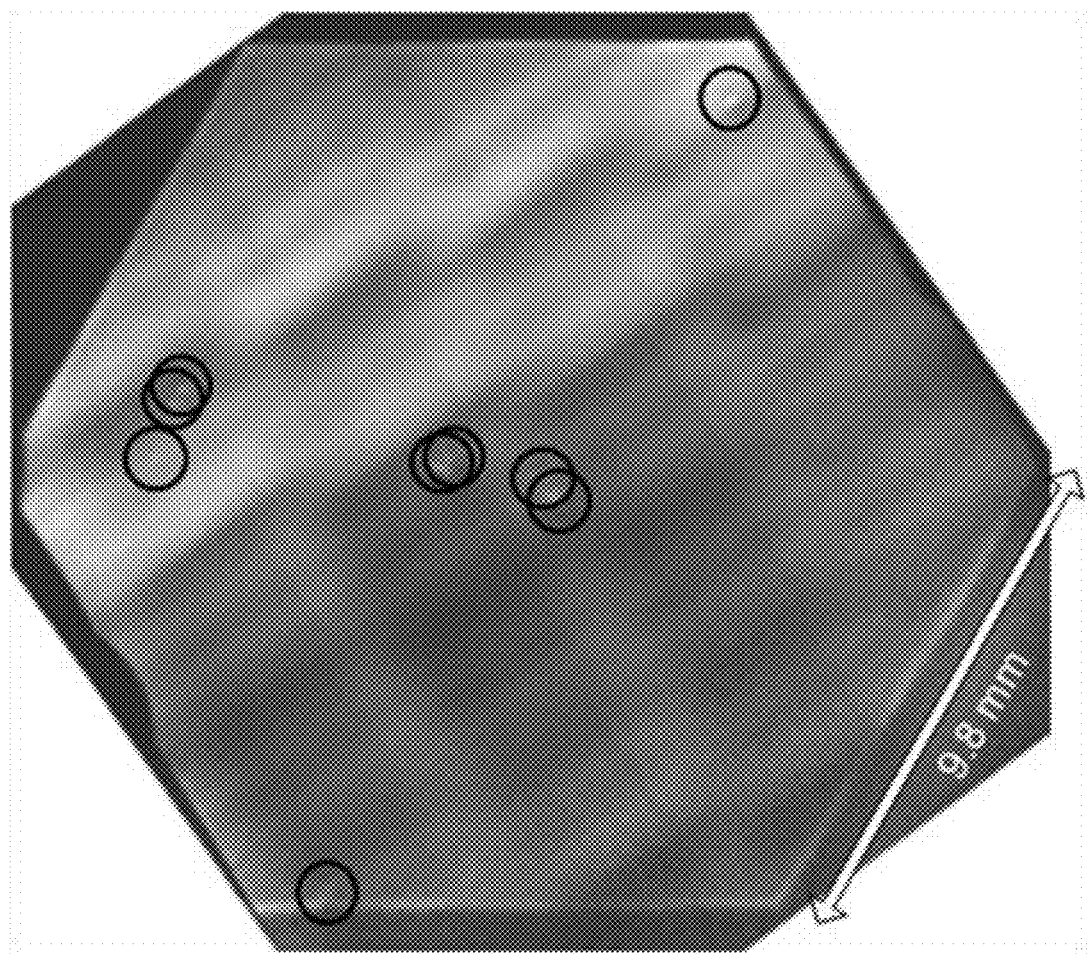
FIG. 2 is a reflection X-ray topography image of an aluminum nitride crystal obtained in Example 1.

Next, in order to remove the polycrystalline aluminum nitride particles abnormally grown at the outer periphery of the substrate, the shape of the outer periphery of the substrate was cut into a hexagon whose sides were each 9.8 mm (2.5 $cm^2$ in area). The surface on the aluminum nitride single crystal layer side was made flat by mechanical polishing. Further, the polishing damage layer of the surface of the aluminum nitride single crystal layer was removed by CMP. The polished amount at this time was 142 µm, and the thickness of the remaining aluminum nitride single crystal layer was 254 µm. The root-mean-square roughness (RMS) measured by observation by an atomic force microscope of 5×5 $\mu m^2$ in visual field was 0.10 nm. A reflection X-ray topography image of a (114) plane of the entire plane of the aluminum nitride single crystal layer on which CMP was carried out was obtained. The number of the bright spots observed by image analysis was 9. The density of the bright spots (number density of the bright spots) was calculated as 3.6 $cm^{-2}$ by dividing 9 by the substrate area of 2.5 $cm^2$ (see FIG. 2). The chlorine content in the aluminum nitride single crystal was measured as 3×$10^{15}$ $cm^{-3}$ in terms of a number density of chlorine atoms, by means of a secondary ion mass spectrometry with $Cs^+$ irradiation at 15 kV of acceleration voltage.

Next, in order to evaluate the transmittance, the aluminum nitride single crystal substrate, which was the seed crystal, was removed by mechanical polishing, whereby an aluminum nitride single crystal free-standing substrate consisting of an aluminum nitride single crystal layer grown by HVPE was obtained. Specifically, a mechanical polishing was carried out from the surface on the aluminum nitride single crystal substrate side, to remove the aluminum nitride single crystal substrate, whereby an aluminum nitride single crystal free-standing substrate of 185 µm in thickness was obtained. The surface roughness of the substrate plane after the mechanical polishing was confirmed by observation by a white coherence interference microscope (NewView 7300 manufactured by Zygo Corporation) with a 50-fold object lens. The value of the root-mean-square roughness (RMS) was 1.2 nm. The linear light transmittance of this free-standing substrate was evaluated by a double beam ultraviolet visible light spectrophotometer (spectrophotometer V-7300 manufactured by JASCO Corporation). The linear light transmittance was 62% at the wavelength of 265 nm and 47.6% at the wavelength of 220 nm. In a linear light transmittance measurement with a plate sample, there is a correlation represented by the following formula, wherein T is a linear light transmittance, x is a plate thickness, R is a reflectance, and α is an absorption coefficient.

$$T=(1-R)^2\exp(-\alpha x)/\{1-R^2\exp(-2\alpha x)\}$$

The reflectance has wavelength dependency. The reflectances at the wavelengths of 265 nm and 220 nm examined with an aluminum nitride single crystal which does not absorb light of ultraviolet region are $R_{265}$=0.160 and $R_{220}$=0.218. Assuming these reflectances, it is possible to obtain the corrected absorption coefficients $\alpha_{265}$ and $\alpha_{220}$ by the above formula, from the linear light transmittance T and the plate thickness of sample x. With this sample, $\alpha_{265}$ was 8.0 m$^{-1}$ and $\alpha_{220}$ was 15 m$^{-1}$.

Example 2

An aluminum nitride single crystal layer was grown on an aluminum nitride single crystal substrate with the same apparatus as in Example 1 except that the current plate, the group III additional halogen-based gas inlet 26, and the group III additional halogen-based gas confluence part 27 were not arranged. A hydrogen chloride gas in an amount of 10.8 sccm and a carrier gas were supplied to a high purity aluminum arranged on a further upstream side of the group III source gas supply nozzle 24, whereby an aluminum chloride gas was generated. From the nitrogen source gas supply nozzle 32, 26 sccm of ammonia gas, 1.3 sccm of hydrogen chloride gas ($R_{V-H}$=0.05), and 172.7 sccm of hydrogen carrier gas (200 sccm in total) were supplied to the reaction area 10. An aluminum nitride single crystal was grown for 10 hours with the substrate 12 heated to 1450° C. Except the above conditions, the same conditions as in Example 1 were applied.

The obtained aluminum nitride single crystal layer had no fractures and cracks. The thickness of the aluminum nitride single crystal layer was 260 µm. The adhesion of particles to the aluminum nitride single crystal layer was observed by a Nomarski differential interference microscope. The number density of the adhesion particles was 5 cm$^{-2}$. The X-ray rocking curve half-value width of a (002) plane was 21 arcsec.

Next, as in Example 1, the outer periphery shape of the substrate was cut out into a hexagon whose bases were each 9.8 mm (2.5 cm$^2$ in area). A mechanical polishing and a CMP were carried out on the surface on the aluminum nitride single crystal layer side. The polished amount at this time was 75 µm, and the thickness of the remaining aluminum nitride single crystal layer was 185 µm. The root-mean-square roughness (RMS) measured by observation by an atomic force microscope of 5×5 µm$^2$ in visual field was 0.13 nm. The number of the bright spots observed in a reflection X-ray topography image of a (114) plane of the entire plane of the aluminum nitride single crystal layer on which CMP was carried out was 38. The bright spot density (number density of bright spot) was calculated as 15 cm$^{-2}$ by dividing 38 by the substrate area of 2.5 cm$^2$. The chlorine content measured by secondary ion mass spectrometry was 4×10$^{15}$ cm$^{-3}$ in terms of a number density of chlorine atoms.

Next, the aluminum nitride single crystal substrate, which was the seed crystal, was removed by mechanical polishing, whereby an aluminum nitride single crystal free-standing substrate consisting of an aluminum nitride single crystal layer grown by HVPE was obtained. The thickness of the obtained aluminum nitride single crystal free-standing substrate was 105 µm. The root-mean-square roughness (RMS) of the surface on which the mechanical polishing was carried out was 1.1 nm, with confirmation of a white coherence interference microscope. The linear light transmittance of the free-standing substrate was evaluated. The linear light transmittance was 67.2% at the wavelength of 265 nm and 59% at the wavelength of 220 nm. The corrected absorption coefficients at the wavelengths of 265 nm and 220 nm, $\alpha_{265}$ and $\alpha_{220}$, were 6.8 cm$^{-1}$ and 7.4 cm$^{-1}$, respectively.

Example 3

An aluminum nitride single crystal layer was grown on an aluminum nitride single crystal substrate with the same apparatus as in Example 1. A hydrogen chloride gas in an amount of 9 sccm was supplied together with the carrier gas, to a high purity aluminum arranged on a further upstream side of the group III source gas supply nozzle 24, whereby an aluminum chloride gas was generated. To the generated aluminum chloride gas, 7 sccm of hydrogen chloride gas was supplied via the group III additional halogen-based gas confluence part 27 to be a mixture gas in an amount of 1800 sccm in total, including 1784 sccm of mixture carrier gas of hydrogen and nitrogen. The mixture gas was supplied from the group III source supply nozzle outlet 25 to the reaction area 10. From the nitrogen source gas supply nozzle 32, 20 sccm of ammonia gas, 20 sccm of hydrogen chloride gas ($R_{V-H}$=1.0), and 160 sccm of hydrogen carrier gas (200 sccm in total) were supplied to the reaction area 10. An aluminum nitride single crystal was grown for 16 hours with the substrate 12 heated to 1450° C. Except the above conditions, the same conditions as in Example 1 were applied.

The obtained aluminum nitride single crystal layer had no fractures or cracks, and the thickness of the aluminum nitride single crystal layer was 336 µm. The adhesion of particles on the aluminum nitride single crystal layer was observed by a Nomarski differential interference microscope. The number density of the adhesion particles was 3 cm$^{-2}$. The X-ray rocking curve half-value width of a (002) plane was 15 arcsec.

Next, as in Example 1, the outer periphery shape of the substrate was cut out into a hexagon whose bases were each 9.8 mm (2.5 cm$^2$ in area). A mechanical polishing and a CMP were carried out on the surface on the aluminum nitride single crystal layer side. The polished amount at this time was 138 µm, and the thickness of the remaining aluminum nitride single crystal layer was 198 µm. The root-mean-square roughness (RMS) measured by observation by an atomic force microscope of 5×5 µm$^2$ in visual field was 0.11 nm. The number of bright spots observed in a reflection X-ray topography image of a (114) plane of the entire face of the aluminum nitride single crystal layer on which CMP was carried out was 13. The bright spot density (number density of bright spot) was calculated as 5.2 cm$^{-2}$ by dividing 13 by the substrate area of 2.5 cm$^2$. The chlorine content measured by secondary ion mass spectrometry was 7×10$^{14}$ cm$^{-3}$ in terms of a number density of chlorine atoms.

Next, the aluminum nitride single crystal substrate, which was the seed crystal, was removed by mechanical polishing, whereby an aluminum nitride single crystal free-standing substrate consisting of an aluminum nitride single crystal layer grown by HVPE was obtained. The thickness of the obtained aluminum nitride single crystal free-standing substrate was 120 µm. The root-mean-square roughness (RMS) of the surface on which the mechanical polishing was carried out was 1.0 nm, with confirmation of a white coherence interference microscope. The linear light transmittance of the free-standing substrate was evaluated. The linear light transmittance was 70.1% at the wavelength of 265 nm and 60% at the wavelength of 220 nm. The corrected absorption coefficients at the wavelengths of 265 nm and 220 nm, $\alpha_{265}$ and $\alpha_{220}$, were 2.6 cm$^{-1}$ and 5.2 cm$^{-1}$, respectively.

Example 4

From the nitrogen source gas supply nozzle 32, 20 sccm of ammonia gas, 50 sccm of hydrogen chloride gas ($R_{V-H}$=2.5), and 130 sccm of hydrogen carrier gas (200 sccm in total) were supplied to the reaction area 10. An aluminum nitride single crystal was grown for 16 hours with the substrate 12 heated to 1450° C. Except the above conditions, the same conditions as in Example 1 were applied.

The obtained aluminum nitride single crystal layer had no fractures or cracks, and the thickness of the aluminum nitride single crystal layer was 272 μm. The adhesion of particles on the aluminum nitride single crystal layer was observed by a Nomarski differential interference microscope. The number density of the adhesion particles was 2 cm$^{-2}$. The X-ray rocking curve half-value width of a (002) plane was 15 arcsec.

Next, as in Example 1, the outer periphery shape of the substrate was cut out into a hexagon whose bases were each 9.8 mm (2.5 cm$^2$ in area). A mechanical polishing and a CMP were carried out on the surface on the aluminum nitride single crystal layer side. The polished amount at this time was 95 μm, and the thickness of the remaining aluminum nitride single crystal layer was 177 μm. The root-mean-square roughness (RMS) measured by observation by an atomic force microscope of 5×5 μm$^2$ in visual field was 0.10 nm. The number of the bright spots observed in a reflection X-ray topography image of a (114) plane of the entire face of the aluminum nitride single crystal layer on which CMP was carried out was 13. The bright spot density (number density of bright spot) was calculated as 4.1 cm$^{-2}$ by dividing 13 by the substrate area of 2.5 cm$^2$. The chlorine content measured by secondary ion mass spectrometry was 8×10$^{14}$ cm$^{-3}$ in terms of a number density of chlorine atoms.

Next, the aluminum nitride single crystal structure, which was the seed crystal, was removed by a mechanical polishing, whereby an aluminum nitride single crystal free-standing substrate consisting of an aluminum nitride single crystal layer grown by HVPE was obtained. The thickness of the obtained aluminum nitride single crystal free-standing substrate was 100 μm. The root-mean-square roughness (RMS) of the surface on which the mechanical polishing was carried out was 1.0 nm, with confirmation of a white coherence interference microscope. The linear light transmittance of the free-standing substrate was evaluated. The linear light transmittance was 69.8% at the wavelength of 265 nm and 61% at the wavelength of 220 nm. The corrected absorption coefficients at the wavelengths of 265 nm and 220 nm, $\alpha_{265}$ and $\alpha_{220}$, were 3.5 cm$^{-1}$ and 4.7 cm$^{-1}$, respectively.

Comparative Example 1

According to Example 1 of Patent Literature 5, an aluminum nitride single crystal was grown with an apparatus including a current plate, without supplying the group V additional halogen-based gas. The configuration of the current plate was the same as the current plate used in Example 1 of the present invention. A HVPE apparatus, having the same structure as the HVPE apparatus used in the above Example 1 of the present description, except that the group III additional halogen-based gas supply nozzle 26 and the group III additional halogen-based gas confluence part 27 were not provided, was used.

As the base substrate, a commercially-available aluminum nitride single crystal substrate of 18 mm in diameter and 500 μm in thickness, manufactured by sublimation technique was used. A hydrogen chloride gas in amount of 10.8 sccm and the carrier gas were supplied to a high purity aluminum arranged on a further upstream side of the group III source gas supply nozzle 24, whereby an aluminum chloride gas was generated. From the nitrogen source gas supply nozzle 32, 26 sccm of ammonia gas and 174 sccm of hydrogen carrier gas (200 sccm in total) were supplied to the reaction area 10. An aluminum nitride single crystal was grown for 10 hours. Except the above conditions, the same conditions as in Example 1 were applied.

The obtained aluminum nitride single crystal layer had no fractures or cracks, and the thickness of the aluminum nitride single crystal layer was 320 μm. The adhesion of particles on the aluminum nitride single crystal layer was observed by a Nomarski differential interference microscope. The number density of the adhesion particles was 2 cm$^{-2}$. The X-ray rocking curve half-value width of a (002) plane was 25 arcsec.

Next, with the same procedures as in Example 1, the outer periphery shape of the substrate was cut out into a tetragon whose bases were each 3 mm (0.09 cm$^2$ in area). A mechanical polishing and a CMP were carried out on the surface on the aluminum nitride single crystal layer side. The polished amount at this time was 115 μm, and the thickness of the remaining aluminum nitride single crystal layer was 205 μm. The root-mean-square roughness (RMS) measured by observation by an atomic force microscope of 5×5 μm$^2$ in visual field was 0.13 nm. The number of the bright spots observed in a reflection X-ray topography image of a (114) plane of the entire plane of the aluminum nitride single crystal layer on which CMP was carried out was 6. The bright spot density (number density of bright spot) was calculated as 67 cm$^{-2}$ by dividing 6 by the substrate area of 0.09 cm$^2$. The chlorine content measured by secondary ion mass spectrometry was 9×10$^{15}$ cm$^{-3}$ in terms of a number density of chlorine atoms.

Next, the aluminum nitride single crystal substrate, which was the seed crystal, was removed by mechanical polishing, whereby an aluminum nitride single crystal free-standing substrate consisting of an aluminum nitride single crystal layer grown by HVPE was obtained. The thickness of the obtained aluminum nitride single crystal free-standing substrate was 150 μm. The root-mean-square roughness (RMS) of the surface on which the mechanical polishing was carried out was 1.1 nm, with confirmation of a white coherence interference microscope. The linear light transmittance of the free-standing substrate was evaluated. The linear light transmittance was 72.4% at the wavelength of 265 nm and 64.2% at the wavelength of 220 nm. The corrected absorption coefficients at the wavelengths of 265 nm and 220 nm, $\alpha_{265}$ and $\alpha_{220}$, were 0 cm$^{-1}$ and 0 cm$^{-1}$, respectively. Here, the correction absorption coefficients were 0, because this sample was used as the reference sample to set the reflectances $R_{265}$ and $R_{220}$.

Comparative Example 2

A crystal was grown under the same conditions as in Example 1 of the present invention except that 31 sccm of ammonia gas and 169 sccm of hydrogen carrier gas (200 sccm in total) were supplied from the nitrogen source gas supply nozzle but the group V additional halogen-based gas was not supplied. The obtained aluminum nitride single crystal layer had no fractures or cracks, and the thickness of the aluminum nitride single crystal layer was 429 μm. The adhesion of particles to the aluminum nitride single crystal layer was observed by a Nomarski differential interference microscope. The number density of the adhesion particles was 6 cm$^{-2}$. The X-ray rocking curve half-value width of a (002) plane was 19 arcsec.

Figure 3:
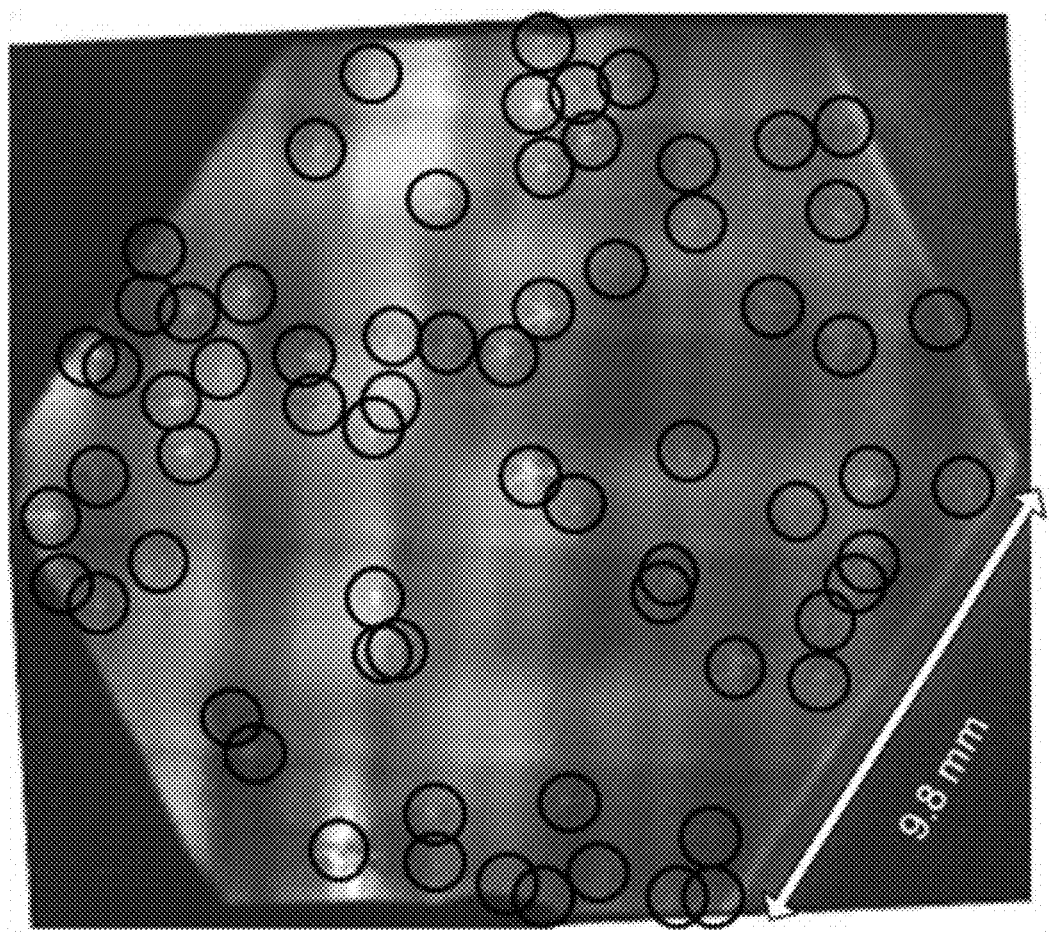
FIG. 3 is a reflection X-ray topography image of an aluminum nitride crystal obtained in Comparative Example 2.

Next, as in Example 1, the outer periphery shape of the substrate was cut out into a hexagon whose bases were each 9.8 mm (2.5 cm$^2$ in area). A mechanical polishing and a CMP were carried out on the surface on the aluminum nitride single crystal layer side. The polished amount at this time was 140 μm, and the thickness of the remaining aluminum nitride single crystal layer was 289 μm. The root-mean-square roughness (RMS) measured by observation by an atomic force microscope of 5×5 μm$^2$ in visual field was 0.12 nm. The number of the bright spots observed in a reflection X-ray topography image of a (114) plane of the entire plane of the aluminum nitride single crystal layer on which CMP was carried out was 68. The bright spot density (number density of bright spot) was calculated as 27 cm$^{-2}$ by dividing 68 by the substrate area of 2.5 cm$^2$ (see FIG. 3). The chlorine content measured by secondary ion mass spectrometry was 3×10$^{15}$ cm$^{-3}$ in terms of a number density of chlorine atoms.

Next, the aluminum nitride single crystal substrate, which was the seed crystal, was removed by mechanical polishing, whereby an aluminum nitride single crystal free-standing substrate consisting of an aluminum nitride single crystal layer grown by HVPE was obtained. The thickness of the obtained aluminum nitride single crystal free-standing substrate was 202 μm. The root-mean-square roughness (RMS) of the surface on which the mechanical polishing was carried out was 1.1 nm, with confirmation by a white coherence interference microscope. The linear light transmittance of the free-standing substrate was evaluated. The linear light transmittance was 50.7% at the wavelength of 265 nm and 41% at the wavelength of 220 nm. The corrected absorption coefficients at the wavelengths of 265 nm and 220 nm, $\alpha_{265}$ and $\alpha_{220}$, were 17 cm$^{-1}$ and 21 cm$^{-1}$, respectively.

The results of the above Examples and Comparative Examples are collectively shown in Table 1.

substrate. An ultrasonic cleaning with commercially-available acetone and isopropyl alcohol was carried out on the base substrate of aluminum nitride single crystal.

After the cleaning of the base substrate, the aluminum nitride single crystal substrate was set on a susceptor made of BN coating graphite in a HVPE apparatus (apparatus of FIG. 1) in such a manner that the Al polar side of the substrate came to the growth plane.

(Preparation for Manufacturing Aluminum Nitride Single Crystal)

The HVPE apparatus used for the growth of the aluminum nitride single crystal had the configuration of FIG. 1. With the configuration of FIG. 1, the apparatus included a current plate arranged on the upstream side by 250 mm from the end of the group III source gas supply nozzle 24 in the reaction vessel 11. The current plate was a plate of quarts glass, including 24 through holes of 3 mm in diameter. The current plate was welded to be arranged to the inner wall of the reaction vessel 11 of quarts glass. An extruding carrier gas supplied from the upstream side of the reaction vessel 11 via the through holes of the current plate was made to flow. As the extruding carrier gas, a mixture carrier gas of hydrogen and nitrogen in which the ratio of hydrogen and nitrogen was 7:3 was used. The total flow amount of the carrier gas was 6500 sccm. The pressure in the reaction vessel 11 in the growth was kept at 0.99 atm.

(Supply of Nitrogen Source Gas: Addition of Group V Additional Halogen-based Gas (Prior Supply of Hydrogen Chloride Gas))

From the nitrogen source gas supply nozzle 32, 20 sccm of ammonia gas, 20 sccm of hydrogen chloride gas, and 160 sccm of hydrogen carrier gas, that is, 200 sccm in total (halogen-based gas (hydrogen chloride gas) 20 sccm/total amount (plurality of gases) 200 sccm), were supplied to the reaction area 10 (onto the base substrate 12). At this time, the temperature of the nitrogen source gas supply nozzle 32 was adjusted to 400° C., so that the ammonia gas and hydrogen chloride gas did not react to each other. In addition, from the barrier gas nozzle (nozzle arranged in a manner to supply a barrier gas from between the nitrogen source gas supply nozzle 32 and the group III source gas supply nozzle 24, though not shown), 1500 sccm of nitrogen gas was supplied.

TABLE 1

|  |  | Example 1 | Example 2 | Example 3 | Example 4 | Comparative Example 1 | Comparative Example 2 |
|---|---|---|---|---|---|---|---|
| $R_{V-H}$ |  | 0.1 | 0.05 | 1.0 | 2.5 | 0.0 | 0.0 |
| Current plate |  | with | without | without | without | with | with |
| X-ray rocking curve FWHM, (002) face | arcsec | 16 | 21 | 15 | 15 | 25 | 19 |
| Adhesive particle | cm$^{-2}$ | 1 | 5 | 3 | 2 | 2 | 6 |
| Bright spot density | cm$^{-2}$ | 3.6 | 15 | 5.2 | 4.1 | 67 | 27 |
| Corrected absorption coefficient $\alpha_\lambda$ |  |  |  |  |  |  |  |
| $\lambda$ = 265 nm | cm$^{-1}$ | 8.0 | 6.8 | 2.6 | 3.5 | 0.0 (Ref) | 17 |
| $\lambda$ = 220 nm | cm$^{-1}$ | 15 | 7.4 | 5.2 | 4.7 | 0.0 (Ref) | 21 |
| Chlorine content | cm$^{-3}$ | 3 × 10$^{15}$ | 4 × 10$^{15}$ | 7 × 10$^{14}$ | 8 × 10$^{14}$ | 9 × 10$^{15}$ | 3 × 10$^{15}$ |

Example 5

(Cleaning of Base Substrate)

A commercially-available aluminum nitride single crystal substrate of 22 mm in diameter and 510 μm in thickness, manufactured by sublimation technique was used as a base (Temperature of Base Substrate)

While 200 sccm of the plurality of gasses in total was supplied from the nitrogen source gas supply nozzle 32 and 1500 sccm of nitrogen gas was supplied from the barrier gas nozzle, the base substrate 12 was heated to 1450° C.

(Supply of Group III Additional Halogen-based Gas (Prior Supply of Hydrogen Chloride Gas))

After the base substrate 12 was heated to 1450° C., 7 sccm of hydrogen chloride gas was supplied from the group III additional halogen-based gas supply nozzle 26 and 1793 sccm of mixture carrier gas of hydrogen and nitrogen was supplied from the source halogen-based gas inlet nozzle 23, whereby 1800 sccm of gases in total (halogen-based gas (hydrogen chloride gas) 7 sccm/total amount 1800 sccm) were supplied from the group III source gas supply nozzle 24. The total flow amount of the gases supplied into the reaction vessel 11 was 10000 sccm.

(Start of Growth By Supply of Group III Source Gas)

After 25 seconds passed from the start of prior supply of hydrogen chloride gas, 9 sccm of hydrogen chloride gas was introduced from the source halogen-based gas inlet nozzle 23, and reacted with a high purity aluminum of 6N grade heated to 400° C. in advance, whereby an aluminum chloride gas was generated. Simultaneously, the mixture carrier gas of hydrogen and nitrogen was reduced by 9 sccm to be 1784 sccm. The aluminum chloride gas was supplied from the group III source gas supply nozzle 24 onto the base substrate 12, whereby a crystal growth was started. The hydrogen chloride gas supply amount $V_{H0}$ before the group III source gas (aluminum chloride gas) was supplied was $V_{H0}=V_H=27$ sccm, and the fraction ($H_{epi}$) of the halogen-based gas (hydrogen chloride gas) after the supply of the group III source gas was started was 0.90.

(Growth of Aluminum Nitride Single Crystal)

An aluminum nitride single crystal was grown for 16 hours under the above conditions of gas flow amount and base substrate temperature. After the aluminum nitride single crystal was grown, the supply of aluminum chloride gas, ammonia gas, and hydrogen chloride gas were stopped, and the crystal was cooled to the room temperature.

(Evaluation of Aluminum Nitride Single Crystal)

Next, in order to remove polycrystalline aluminum nitride particles abnormally grown at the outer periphery of the layer substrate of the obtained aluminum nitride single crystal, the aluminum nitride single crystal was cut into a hexagon whose bases were each 9.8 mm, and the surface on the grown aluminum nitride single crystal side was made flat by mechanical polishing. Further, the polishing damage layer of the aluminum nitride single crystal plane was removed by CMP. The area of the hexagon was 2.5 cm². After that, a reflection X-ray topography image of a (114) plane of the entire plane of the aluminum nitride single crystal on which CMP was carried out was obtained.

(Repeat Manufacturing)

Under the same conditions as above, an aluminum nitride single crystal was manufactured for 5 times using the same reaction vessel, and the evaluation thereof was carried out. The minimum value of the bright spot densities of the obtained aluminum nitride single crystals was 1.5 cm⁻², and the maximum value was 5.2 cm⁻². The average value of the bright spot densities was 2.8 cm⁻², the standard deviation was 1.4 cm⁻², and standard deviation/average density was 52%. The results are shown in Table 2.

Example 6

The apparatus shown in FIG. 1 was used in the same way as in Example 5. For (Cleaning of base substrate) and (Preparation for manufacturing aluminum nitride single crystal), the same procedures as in Example 5 were carried out.

(Supply of Nitrogen Source Gas: Addition of Group V Additional Halogen-based Gas (Prior Supply of Hydrogen Chloride Gas))

From the nitrogen source gas supply nozzle 32, 20 sccm of ammonia gas, 120 sccm of hydrogen chloride gas, and 60 sccm of hydrogen carrier gas, that is, 200 sccm in total (halogen-based gas (hydrogen chloride gas) 120 sccm/total amount (plurality of gases) 200 sccm), were supplied to the reaction area 10. From the barrier gas nozzle, 1500 sccm of nitrogen gas was supplied. At this time, the temperature of the nitrogen source gas supply nozzle 32 was adjusted to 400° C., so that the ammonia gas and the hydrogen chloride gas did not react with each other.

(Temperature of Base Substrate)

While 200 sccm in total of the plurality of gases were supplied from the nitrogen source gas supply nozzle 32 and 1500 sccm of nitrogen gas was supplied from the barrier gas nozzle as described above, the base substrate 12 was heated to 1450° C.

(Supply of Group III Additional Halogen-based Gas (Prior Supply of Hydrogen Chloride Gas))

After the base substrate 12 was heated to 1450° C., 27 sccm of hydrogen chloride gas was supplied from the group III additional halogen-based gas supply nozzle 26, and 1773 sccm of mixture carrier gas of hydrogen and nitrogen was supplied from the source halogen-based gas inlet nozzle 23, whereby 1800 sccm of gases in total (halogen-based gas (hydrogen chloride gas) 27 sccm/total amount 1800 sccm) were supplied from the group III source gas supply nozzle 24. The total flow amount of the gases supplied into the reaction vessel 11 was 10000 sccm.

(Start of Growth By Supply of Group III Source Gas)

After 25 seconds passed from the start of prior supply of the hydrogen chloride gas, 9 sccm of hydrogen chloride gas was introduced from the source halogen-based gas inlet nozzle 23, to react the gas with a high purity aluminum of 6N grade heated to 400° C. in advance, whereby an aluminum chloride gas was generated. Simultaneously, the mixture carrier gas of hydrogen and nitrogen was reduced by 9 sccm to be 1764 sccm. The aluminum chloride gas was supplied from the group III source gas supply nozzle 24 onto the base substrate 12, whereby a crystal growth was started. The hydrogen chloride gas supply amount $V_{H0}$ before the group III source gas (aluminum chloride gas) was supplied was $V_{H0}=V_H=147$ sccm. The fraction ($H_{epi}$) of the halogen-based gas (hydrogen chloride gas) after the supply of the group III source gas was started was 0.98.

For (Growth of aluminum nitride single crystal), (Evaluation of aluminum nitride single crystal) and (Repeat manufacturing), the same procedures as in Example 5 were carried out. For each of five obtained aluminum nitride single crystals, a reflection X-ray topography image of a (114) plane was obtained. As a result, the minimum value of the bright spot densities was 0.5 cm⁻², and the maximum value was 2.9 cm⁻². The average value of the bright spot densities was 1.8 cm⁻², the standard deviation was 1.0 cm⁻², and standard deviation/average value was 59%. The results are shown in Table 2.

TABLE 2

|  |  | Example 5 | Example 6 |
|---|---|---|---|
| Halogen-based gas prior supply amount $V_{H0}$ | sccm | 27 | 147 |
| Fraction of halogen-based gas when crystal is growing $H_{epi} = V_H/(V_H + V_{III})$ |  | 0.90 | 0.98 |
| Number density of bright spot |  |  |  |
| Minimum value | $cm^{-2}$ | 1.5 | 0.5 |
| Maximum value | $cm^{-2}$ | 5.2 | 2.9 |
| Average value | $cm^{-2}$ | 2.8 | 1.8 |
| Standard deviation | $cm^{-2}$ | 1.4 | 1.0 |
| Standard deviation/Average value | % | 52 | 59 |

REFERENCES SIGN LIST 10 reaction area
11 reaction vessel
12 substrate (base substrate)
13 susceptor
14 extruding gas inlet
15 exhaust outlet
16 source part outer heater
17 growth part outer heater
20 source part reaction area
21 source part reaction vessel
22 group III metal source
23 source halogen-based gas inlet nozzle
24 group III source gas supply nozzle
25 group III additional halogen-based gas supply nozzle
27 group III additional halogen-based gas confluence part
31 nitrogen source gas inlet
32 nitrogen source gas supply nozzle
33 nitrogen source gas outlet
34 group V additional halogen-based gas inlet nozzle
35 junction
36 prior supply gas calculation area in reaction area
100 group III nitride single crystal manufacturing apparatus

The invention claimed is:

1. A method of manufacturing a group III nitride single crystal comprising the step of:
(a) supplying a group III source gas and a nitrogen source gas to the reaction area of an apparatus for manufacturing the group III nitride single crystal comprising:
a reaction vessel comprising a reaction area, wherein in the reaction area, a group III source gas and a nitrogen source gas are reacted such that a group III nitride crystal is grown on a substrate;
a susceptor arranged in the reaction area and supporting the substrate;
a group III source gas supply nozzle supplying the group III source gas to the reaction area; and
a nitrogen source gas supply nozzle supplying the nitrogen source gas to the reaction area,
wherein the nitrogen source gas supply nozzle is configured to supply the nitrogen source gas and at least one halogen-based gas selected from the group consisting of a hydrogen halide gas and a halogen gas to the reaction area;
wherein the nitrogen source gas supply nozzle comprises:
a nitrogen source gas inlet from which the nitrogen source gas is introduced to the reaction vessel;
a nitrogen source gas outlet from which the nitrogen source gas flows out to the reaction area; and
a junction arranged between the nitrogen source gas inlet and the nitrogen source gas outlet, wherein a halogen-based gas inlet nozzle is joined to the nitrogen source gas supply nozzle at the junction, and wherein the halogen-based gas inlet nozzle supplies at least one halogen-based gas selected from a group consisting of a hydrogen halide gas and a halogen gas, such that the group III source gas and the nitrogen source gas react,
wherein in the step (a), the nitrogen source gas and at least one halogen-based gas selected from a hydrogen halide gas and a halogen gas are supplied to the reaction area from the nitrogen source gas supply nozzle; and
wherein in the step (a), the nitrogen source gas joins with the halogen-based gas at the junction, and thereafter is supplied from the nitrogen source gas outlet to the reaction area.

2. The method of manufacturing the group III nitride single crystal according to claim 1,
wherein in the step (a), supply of the halogen-based gas onto the substrate is begun before supplying the group III source gas.

3. The method of manufacturing the group III nitride single crystal according to claim 1,
wherein the step (a) comprises the successive steps of:
(i) beginning to supply the nitrogen source gas onto the substrate;
(ii) beginning to supply the halogen-based gas onto the substrate;
(iii) beginning to supply the group III source gas onto the substrate.

4. The method of manufacturing the group III nitride single crystal according to claim 2,
wherein in the step (a), the halogen-based gas is continuously supplied; and
when the group III source gas is supplied, the halogen-based gas and the group III source gas are supplied such that the following formula (1) is satisfied:

$$0.5 \leq V_H/(V_H+V_{III}) < 1.0 \qquad (1)$$

(in the formula (1), $V_H$ represents a supply amount of the halogen-based gas under standard state conditions (sccm); and $V_{III}$ represents a supply amount of the group III source gas under standard state conditions (sccm).).

5. The method of manufacturing the group III nitride single crystal according to claim 2, further comprising the step of:
(b) repeating the step (a) using the same apparatus for manufacturing the group III nitride single crystal, such that a plurality of group III nitride single crystals are produced.

6. A method of manufacturing a wafer comprising:
manufacturing an aluminum nitride single crystal by the method according to claim 1,
obtaining a free-standing aluminum nitride single crystal substrate from the aluminum nitride single crystal; and
forming a layer of light emission devices over the free-standing aluminum nitride single crystal substrate.

7. A method of manufacturing a light emitting diode comprising:
manufacturing a wafer by the method as in claim 6; and
cutting the wafer.

8. A method of manufacturing a group III nitride single crystal comprising the step of:
(a) supplying a group III source gas and a nitrogen source gas to the reaction area of an apparatus for manufacturing the group III nitride single crystal comprising:

a reaction vessel comprising a reaction area, wherein in the reaction area, a group III source gas and a nitrogen source gas are reacted such that a group III nitride crystal is grown on a substrate;

a susceptor arranged in the reaction area and supporting the substrate;

a group III source gas supply nozzle supplying the group III source gas to the reaction area; and a nitrogen source gas supply nozzle supplying the nitrogen source gas to the reaction area, wherein the nitrogen source gas supply nozzle is configured to supply the nitrogen source gas and at least one halogen-based gas selected from the group consisting of a hydrogen halide gas and a halogen gas to the reaction area;

wherein the nitrogen source gas supply nozzle comprises:

a nitrogen source gas inlet from which the nitrogen source gas is introduced to the reaction vessel;

a nitrogen source gas outlet from which the nitrogen source gas flows out to the reaction area; and a junction arranged between the nitrogen source gas inlet and the nitrogen source gas outlet, wherein a halogen-based gas inlet nozzle is joined to the nitrogen source gas supply nozzle at the junction, and wherein the halogen-based gas inlet nozzle supplies at least one halogen-based gas selected from a group consisting of a hydrogen halide gas and a halogen gas, such that the group III source gas and the nitrogen source gas react, wherein in the step (a), the nitrogen source gas and at least one halogen-based gas selected from a hydrogen halide gas and a halogen gas are supplied to the reaction area from the nitrogen source gas supply nozzle; and the group III source gas supply nozzle comprises a second junction and a group III source gas outlet, wherein a second halogen-based gas inlet nozzle is joined to the group III source gas supply nozzle at the second junction, wherein the second halogen-based gas inlet nozzle supplies at least one halogen-based gas selected from a group consisting of a hydrogen halide gas and a halogen gas, and wherein the group III source gas joins with the halogen-based gas at the second junction and thereafter flows out from the group III source gas outlet to the reaction area.

9. The method of manufacturing a group III nitride single crystal according to claim 1, wherein the group III source gas supply nozzle comprises a second junction and a group III source gas outlet, wherein a second halogen-based gas inlet nozzle is joined to the group III source gas supply nozzle at the second junction, and wherein the second halogen-based gas inlet nozzle supplies at least one halogen-based gas selected from a group consisting of a hydrogen halide gas and a halogen gas, and wherein the group III source gas joins with the halogen-based gas at the second junction and thereafter flows out from the group III source gas outlet to the reaction area.

* * * * *